(12) United States Patent
Bright

(10) Patent No.: US 8,541,942 B2
(45) Date of Patent: *Sep. 24, 2013

(54) TRANSPARENT CONDUCTIVE ARTICLES AND METHODS OF MAKING SAME

(75) Inventor: Clark I. Bright, Tucson, AZ (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/532,181

(22) Filed: Jun. 25, 2012

(65) Prior Publication Data

US 2012/0262056 A1    Oct. 18, 2012

Related U.S. Application Data

(60) Continuation of application No. 12/964,909, filed on Dec. 10, 2010, now Pat. No. 8,241,752, which is a continuation of application No. 11/859,581, filed on Sep. 21, 2007, now abandoned, which is a division of application No. 10/317,623, filed on Dec. 12, 2002, now Pat. No. 7,276,291, which is a continuation of application No. 09/939,008, filed on Aug. 24, 2001, now Pat. No. 7,186,465, which is a division of application No. 09/419,870, filed on Oct. 18, 1999, now abandoned.

(60) Provisional application No. 60/106,871, filed on Nov. 2, 1998.

(51) Int. Cl.
*H05B 33/00* (2006.01)
*H01J 9/00* (2006.01)

(52) U.S. Cl.
USPC ........... 313/506; 313/504; 428/469; 428/457; 427/66; 445/23

(58) Field of Classification Search
None
See application file for complete search history.

(56) References Cited

U.S. PATENT DOCUMENTS

| 2,741,769 A | 1/1954 | White |
| 2,676,117 A | 4/1954 | Colbert |

(Continued)

FOREIGN PATENT DOCUMENTS

| BE | 704 297 | 10/1967 |
| DE | 196 03 746 | 4/1997 |

(Continued)

OTHER PUBLICATIONS

Affinito et al., "A New Method for Fabricating Transparent Barrier Layers," Thin Solid Films, (1996), pp. 63-67, vol. 290/291, Elsevier Science S.A.

(Continued)

*Primary Examiner* — Ashok Patel
(74) *Attorney, Agent, or Firm* — Adam Bramwell; Adrian L. Pishko; James A. Baker

(57) ABSTRACT

A lightweight, flexible, plastic substrate is coated with at least one layer, such that the substrate has desired barrier and electrode characteristics useful in constructing OLED displays. The layer has both a low enough resistance to function as an electrode for the display, and low oxygen and moisture permeability. The display is thereby protected from oxygen and moisture degradation. For lower permeability and/or higher conductivity, multiple alternating layers of barrier materials and conductive materials may be applied. The barrier material includes at least one of a thin metallic film, an organic polymer, a thin transparent dielectric, a thin transparent metal nitride, and a thin transparent conductive oxide. The conductive material includes at least one of a thin transparent conductive oxide, a thin transparent metallic film, and a thin transparent metal nitride. Preferably, a multilayer polymer base coat is deposited over the substrate to exclude moisture and atmospheric gases.

11 Claims, 23 Drawing Sheets

(56) References Cited

U.S. PATENT DOCUMENTS

| | | | |
|---|---|---|---|
| 3,018,262 | A | 1/1962 | Schroeder |
| 3,302,002 | A | 1/1967 | Warren |
| 3,311,517 | A | 3/1967 | Keslar |
| 3,475,307 | A | 10/1969 | Knox |
| 3,529,074 | A | 9/1970 | Lewis |
| 3,601,471 | A | 8/1971 | Seddon |
| 3,607,365 | A | 9/1971 | Lindlof |
| 3,682,528 | A | 8/1972 | Apfel |
| 3,682,582 | A | 8/1972 | Hirshfeld |
| 3,720,541 | A | 3/1973 | King |
| 3,729,313 | A | 4/1973 | Smith |
| 3,752,348 | A | 8/1973 | Dickason |
| 3,779,778 | A | 12/1973 | Smith |
| 3,808,006 | A | 4/1974 | Smith |
| 3,825,917 | A | 7/1974 | Lucky |
| 3,897,140 | A | 7/1975 | Tuthill |
| 3,990,784 | A | 11/1976 | Gelber |
| 4,017,661 | A | 4/1977 | Gillery |
| 4,098,965 | A | 7/1978 | Kinsman |
| 4,166,876 | A | 9/1979 | Chiba |
| 4,226,910 | A | 10/1980 | Dahlen |
| 4,234,654 | A | 11/1980 | Yatabe |
| 4,250,053 | A | 2/1981 | Smith |
| 4,279,717 | A | 7/1981 | Eckberg |
| 4,283,482 | A | 8/1981 | Hattori |
| 4,320,169 | A | 3/1982 | Yatabe |
| 4,337,990 | A | 7/1982 | Fan |
| 4,394,403 | A | 7/1983 | Smith |
| 4,413,877 | A | 11/1983 | Suzuki |
| 4,463,047 | A | 7/1984 | Matteucci |
| 4,491,628 | A | 1/1985 | Ito et al. |
| 4,537,814 | A | 8/1985 | Itoh |
| 4,556,277 | A | 12/1985 | Fan |
| 4,565,719 | A | 1/1986 | Phillips |
| 4,581,337 | A | 4/1986 | Frey |
| 4,590,118 | A | 5/1986 | Yatabe |
| 4,600,627 | A | 7/1986 | Honda |
| 4,624,867 | A | 11/1986 | Iijima |
| 4,639,069 | A | 1/1987 | Yatabe |
| 4,642,126 | A | 2/1987 | Zador |
| 4,645,714 | A | 2/1987 | Roche |
| 4,652,274 | A | 3/1987 | Boettcher |
| 4,654,067 | A | 3/1987 | Ramus |
| 4,695,618 | A | 9/1987 | Mowrer |
| 4,696,719 | A | 9/1987 | Bischoff |
| 4,699,830 | A | 10/1987 | White |
| 4,710,426 | A | 12/1987 | Stephens |
| 4,721,349 | A | 1/1988 | Fan |
| 4,722,515 | A | 2/1988 | Ham |
| 4,782,216 | A | 11/1988 | Woodard |
| 4,786,767 | A | 11/1988 | Kuhlman |
| 4,786,783 | A | 11/1988 | Woodard |
| 4,799,745 | A | 1/1989 | Meyer |
| 4,806,220 | A | 2/1989 | Finley |
| 4,828,346 | A | 5/1989 | Jacobsen |
| 4,842,893 | A | 6/1989 | Yializis |
| 4,873,139 | A | 10/1989 | Kinoskly |
| 4,910,090 | A | 3/1990 | Kuhlman |
| 4,954,371 | A | 9/1990 | Yializis |
| 4,959,257 | A | 9/1990 | Mukherjee |
| 4,965,408 | A | 10/1990 | Chapman |
| 4,973,511 | A | 11/1990 | Farmer |
| 4,977,013 | A | 12/1990 | Ritchie |
| 5,011,585 | A | 4/1991 | Brochot |
| 5,013,416 | A | 5/1991 | Murayama |
| 5,018,048 | A | 5/1991 | Shaw |
| 5,028,759 | A | 7/1991 | Finley |
| 5,032,461 | A | 7/1991 | Shaw |
| 5,059,295 | A | 10/1991 | Finley |
| 5,071,206 | A | 12/1991 | Hood |
| 5,085,141 | A | 2/1992 | Triffaux |
| 5,091,244 | A | 2/1992 | Biornard |
| 5,097,800 | A | 3/1992 | Shaw |
| 5,111,329 | A | 5/1992 | Gajewski |
| 5,125,138 | A | 6/1992 | Shaw |
| 5,235,015 | A | 8/1993 | Ali |
| 5,237,439 | A | 8/1993 | Misono |
| 5,260,095 | A | 11/1993 | Affinito |
| 5,270,517 | A | 12/1993 | Finley |
| 5,306,547 | A | 4/1994 | Hood |
| 5,324,374 | A | 6/1994 | Harmand |
| 5,332,888 | A | 7/1994 | Tausch |
| 5,354,497 | A | 10/1994 | Fukuchi |
| 5,356,947 | A | 10/1994 | Ali |
| 5,360,659 | A | 11/1994 | Arends |
| 5,377,045 | A | 12/1994 | Wolfe |
| 5,395,644 | A | 3/1995 | Affinito |
| 5,427,638 | A | 6/1995 | Goetz |
| 5,427,861 | A | 6/1995 | D'Errico |
| 5,440,446 | A | 8/1995 | Shaw |
| 5,457,356 | A | 10/1995 | Parodos |
| 5,489,489 | A | 2/1996 | Swirbel |
| 5,506,037 | A | 4/1996 | Termath |
| 5,510,173 | A | 4/1996 | Pass |
| 5,521,765 | A | 5/1996 | Wolfe |
| 5,529,849 | A | 6/1996 | D'Errico |
| 5,536,323 | A | 7/1996 | Kirlin |
| 5,540,446 | A | 7/1996 | Felsen |
| 5,545,676 | A | 8/1996 | Palazzotto |
| 5,547,508 | A | 8/1996 | Affinito |
| 5,547,908 | A | 8/1996 | Furuzawa |
| 5,554,220 | A | 9/1996 | Forrest |
| 5,576,101 | A | 11/1996 | Saitoh |
| 5,593,221 | A | 1/1997 | Evanicky |
| 5,607,789 | A | 3/1997 | Treger |
| 5,620,524 | A | 4/1997 | Fan |
| 5,629,389 | A | 5/1997 | Roitman |
| 5,654,084 | A | 8/1997 | Egert |
| 5,681,615 | A | 10/1997 | Affinito |
| 5,681,666 | A | 10/1997 | Treger |
| 5,684,084 | A | 11/1997 | Lewin |
| 5,686,360 | A | 11/1997 | Harvey, III |
| 5,693,956 | A | 12/1997 | Shi |
| 5,699,188 | A | 12/1997 | Gilbert |
| 5,711,816 | A | 1/1998 | Kirlin |
| 5,725,909 | A | 3/1998 | Shaw |
| 5,731,661 | A | 3/1998 | So |
| 5,739,180 | A | 4/1998 | Taylor-Smith |
| 5,744,227 | A * | 4/1998 | Bright et al. .................. 428/216 |
| 5,747,182 | A | 5/1998 | Friend |
| 5,753,346 | A | 5/1998 | Leir |
| 5,756,192 | A | 5/1998 | Crawley |
| 5,757,126 | A | 5/1998 | Harvey, III |
| 5,759,329 | A | 6/1998 | Krause |
| 5,771,562 | A | 6/1998 | Harvey, III |
| 5,773,102 | A | 6/1998 | Rehfeld |
| 5,780,174 | A * | 7/1998 | Tokito et al. .................. 428/690 |
| 5,783,049 | A | 7/1998 | Bright |
| 5,792,550 | A | 8/1998 | Phillips |
| 5,811,177 | A | 9/1998 | Shi |
| 5,811,183 | A | 9/1998 | Shaw |
| 5,821,692 | A | 10/1998 | Rogers |
| 5,844,363 | A * | 12/1998 | Gu et al. ....................... 313/506 |
| 5,856,373 | A | 1/1999 | Kaisaki |
| 5,869,761 | A | 2/1999 | Nakamura |
| 5,872,355 | A | 2/1999 | Hueschen |
| 5,877,895 | A | 3/1999 | Shaw |
| 5,891,554 | A | 4/1999 | Hosokawa |
| 5,896,119 | A | 4/1999 | Evanicky |
| 5,902,641 | A | 5/1999 | Affinito |
| 5,902,688 | A | 5/1999 | Antoniadis |
| 5,904,958 | A | 5/1999 | Dick |
| 5,912,069 | A | 6/1999 | Yializis |
| 5,921,670 | A | 7/1999 | Schumacher |
| 5,922,161 | A | 7/1999 | Wu |
| 5,945,174 | A | 8/1999 | Shaw |
| 5,948,552 | A | 9/1999 | Antoniadis |
| 5,965,907 | A | 10/1999 | Huang |
| 5,981,059 | A | 11/1999 | Bright |
| 5,996,498 | A | 12/1999 | Lewis |
| 5,998,495 | A | 12/1999 | Oxman |
| 6,007,901 | A | 12/1999 | Maschwitz |
| 6,025,406 | A | 2/2000 | Oxman |
| 6,030,671 | A | 2/2000 | Yang |

| | | |
|---|---|---|
| 6,034,813 A | 3/2000 | Woodard |
| 6,039,553 A | 3/2000 | Lundin |
| 6,040,017 A | 3/2000 | Mikhael |
| 6,040,056 A | 3/2000 | Anaki |
| 6,040,939 A | 3/2000 | Demiryont |
| 6,045,864 A | 4/2000 | Lyons |
| 6,049,419 A | 4/2000 | Wheatley |
| 6,066,826 A | 5/2000 | Yializis |
| 6,077,462 A | 6/2000 | Lundin |
| 6,083,628 A | 7/2000 | Yializis |
| 6,092,269 A | 7/2000 | Yializis |
| 6,097,147 A * | 8/2000 | Baldo et al. .................. 313/506 |
| 6,104,530 A | 8/2000 | Okamura |
| 6,106,627 A | 8/2000 | Yializis |
| 6,107,357 A | 8/2000 | Hawker |
| 6,111,698 A | 8/2000 | Woodard |
| 6,118,218 A | 9/2000 | Yializis |
| 6,132,882 A | 10/2000 | Landin |
| 6,146,225 A | 11/2000 | Sheats |
| 6,146,462 A | 11/2000 | Yializis |
| 6,167,182 A | 12/2000 | Shinohara |
| 6,187,120 B1 | 2/2001 | Ono |
| 6,194,487 B1 | 2/2001 | Morimoto |
| 6,198,220 B1 | 3/2001 | Jones |
| 6,204,408 B1 | 3/2001 | Bassler |
| 6,204,480 B1 | 3/2001 | Woodard |
| 6,214,422 B1 | 4/2001 | Yializis |
| 6,231,939 B1 | 5/2001 | Shaw |
| 6,243,201 B1 | 6/2001 | Fleming |
| 6,252,703 B1 | 6/2001 | Nakamura |
| 6,255,003 B1 | 7/2001 | Woodard |
| 6,268,695 B1 | 7/2001 | Affinito |
| 6,316,343 B1 | 11/2001 | Wada |
| 6,352,761 B1 | 3/2002 | Hebrink |
| 6,352,777 B1 | 3/2002 | Bulovic |
| 6,357,880 B2 | 3/2002 | Epstein |
| 6,368,699 B1 | 4/2002 | Gilbert |
| 6,376,065 B1 | 4/2002 | Korba |
| 6,379,592 B1 | 4/2002 | Lundin |
| 6,399,228 B1 | 6/2002 | Simpson |
| 6,413,645 B1 | 7/2002 | Graff |
| 6,416,872 B1 | 7/2002 | Maschwitz |
| 6,417,619 B1 | 7/2002 | Yasunori |
| 6,425,673 B1 | 7/2002 | Suga |
| 6,440,642 B1 | 8/2002 | Shelnut |
| 6,459,514 B2 | 10/2002 | Gilbert |
| 6,469,437 B1 | 10/2002 | Parthasarathy |
| 6,492,026 B1 | 12/2002 | Graff |
| 6,495,752 B1 | 12/2002 | Sugizaki |
| 6,522,067 B1 | 2/2003 | Graff |
| 6,541,133 B1 | 4/2003 | Schicht |
| 6,565,982 B1 | 5/2003 | Ouderkirk |
| 6,573,652 B1 | 6/2003 | Graff |
| 6,579,423 B2 | 6/2003 | Anzaki |
| 6,635,989 B1 | 10/2003 | Nilsson |
| 6,641,900 B2 | 11/2003 | Hebrink |
| 6,650,478 B1 | 11/2003 | DeBusk |
| 6,673,438 B1 | 1/2004 | Bond |
| 6,679,971 B2 | 1/2004 | Tone |
| 6,737,154 B2 | 5/2004 | Jonza |
| 6,740,289 B1 | 5/2004 | Ono |
| 6,783,349 B2 | 8/2004 | Neavin |
| 6,797,396 B1 | 9/2004 | Liu |
| 6,808,658 B2 | 10/2004 | Stover |
| 6,811,867 B1 | 11/2004 | McGurran |
| 6,818,291 B2 | 11/2004 | Funkenbusch |
| 6,830,713 B2 | 12/2004 | Hebrink |
| 6,833,391 B1 | 12/2004 | Chisholm |
| 6,872,793 B1 | 3/2005 | Schlueter |
| 6,929,864 B2 | 8/2005 | Fleming |
| 6,933,051 B2 | 8/2005 | Fleming |
| 6,946,188 B2 | 9/2005 | Hebrink |
| 6,965,191 B2 | 11/2005 | Koike |
| 7,018,713 B2 | 3/2006 | Padiyath |
| 7,148,360 B2 | 12/2006 | Flynn |
| 7,150,907 B2 | 12/2006 | Hebrink |
| 7,169,328 B2 | 1/2007 | Miller |
| 7,171,105 B2 | 1/2007 | Winkler |
| 7,186,465 B2 | 3/2007 | Bright |
| 7,215,473 B2 | 5/2007 | Fleming |
| 7,238,401 B1 | 7/2007 | Dietz |
| 7,253,809 B2 | 8/2007 | Boyd |
| 7,261,950 B2 | 8/2007 | Fleming |
| 7,276,291 B2 | 10/2007 | Bright |
| 7,351,479 B2 | 4/2008 | Funkenbusch |
| 7,364,339 B2 | 4/2008 | Park |
| 7,393,557 B2 | 7/2008 | Fleming |
| 7,525,454 B2 | 4/2009 | Jung |
| 7,683,279 B2 | 3/2010 | Kim |
| 2001/0010846 A1 | 8/2001 | Hofmeister |
| 2002/0022156 A1 | 2/2002 | Bright |
| 2003/0016930 A1 | 1/2003 | Inditsky |
| 2003/0124392 A1 | 7/2003 | Bright |
| 2003/0184222 A1 | 10/2003 | Nilsson |
| 2003/0228476 A1 | 12/2003 | Buhay |
| 2004/0032658 A1 | 2/2004 | Fleming |
| 2004/0033369 A1 | 2/2004 | Fleming |
| 2004/0179348 A1 | 9/2004 | Pesenti |
| 2004/0241396 A1 | 12/2004 | Jing |
| 2005/0181123 A1 | 8/2005 | Fleming |
| 2006/0035073 A1 | 2/2006 | Funkenbusch |
| 2006/0055308 A1 | 3/2006 | Lairson |
| 2006/0105149 A1 | 5/2006 | Donahue |
| 2006/0115214 A1 | 6/2006 | Cassarly |
| 2006/0132453 A1 | 6/2006 | Boyd |
| 2007/0013663 A1 | 1/2007 | Park |
| 2007/0014097 A1 | 1/2007 | Park |
| 2007/0035843 A1 | 2/2007 | Cassarly |
| 2007/0191506 A1 | 8/2007 | Lu |
| 2007/0279935 A1 | 12/2007 | Gardiner |
| 2008/0008893 A1 | 1/2008 | Bright |
| 2008/0037284 A1 | 2/2008 | Rudisill |
| 2008/0160185 A1 | 7/2008 | Endle |
| 2008/0257475 A1 | 10/2008 | Fleming |
| 2009/0067151 A1 | 3/2009 | Sahlin |
| 2009/0109537 A1 | 4/2009 | Bright |
| 2009/0303602 A1 | 12/2009 | Bright |
| 2010/0089621 A1 | 4/2010 | Stoss |
| 2011/0074282 A1 | 3/2011 | Bright |
| 2012/0125660 A1 | 5/2012 | Bright |
| 2012/0127578 A1 | 5/2012 | Bright |

FOREIGN PATENT DOCUMENTS

| | | |
|---|---|---|
| EP | 0 299 753 | 1/1988 |
| EP | 0 260 626 | 3/1988 |
| EP | 0 332 717 | 9/1989 |
| EP | 0 340 935 | 11/1989 |
| EP | 0 390 540 | 10/1990 |
| EP | 0 547 550 | 6/1993 |
| EP | 0 590 467 | 4/1994 |
| EP | 0 691 553 | 1/1996 |
| EP | 0 787 826 | 8/1997 |
| EP | 0 810 452 | 12/1997 |
| EP | 0 931 850 | 7/1999 |
| EP | 0 977 469 | 2/2000 |
| GB | 1446849 | 8/1976 |
| JP | 57-159645 | 10/1982 |
| JP | 59-70558 | 4/1984 |
| JP | 61-3743 | 1/1986 |
| JP | 61-43555 | 3/1986 |
| JP | 61-79644 | 4/1986 |
| JP | 61-277114 | 12/1986 |
| JP | 62-217506 | 9/1987 |
| JP | 63-136316 | 6/1988 |
| JP | 64-18441 | 1/1989 |
| JP | 2-183230 | 7/1990 |
| JP | 4-369 | 1/1992 |
| JP | 4-48515 | 2/1992 |
| JP | 04-230906 | 8/1992 |
| JP | 06-136159 | 5/1994 |
| JP | 06-251631 | 9/1994 |
| JP | 8-325713 | 12/1996 |
| JP | 9-59763 | 3/1997 |
| JP | 09-291356 | 11/1997 |
| JP | 10-13083 | 1/1998 |
| JP | 2008-181791 | 8/2008 |
| KR | 10-2006-0119292 | 11/2006 |
| WO | WO 87/07848 | 12/1987 |

| WO | WO 92/12219 | 7/1992 |
| --- | --- | --- |
| WO | WO 95/10117 | 4/1995 |
| WO | WO 97/01440 | 1/1997 |
| WO | WO 97/01778 | 1/1997 |
| WO | WO 97/04885 | 2/1997 |
| WO | WO 97/16053 | 5/1997 |
| WO | WO 97/22631 | 6/1997 |
| WO | WO 97/37844 | 10/1997 |
| WO | WO 98/10116 | 3/1998 |
| WO | WO 98/18852 | 5/1998 |
| WO | WO 98/26927 | 6/1998 |
| WO | WO 99/16557 | 4/1999 |
| WO | WO 99/16931 | 4/1999 |
| WO | WO 99/36248 | 7/1999 |
| WO | WO 99/36262 | 7/1999 |
| WO | WO 00/26973 | 5/2000 |
| WO | WO 00/36665 | 6/2000 |
| WO | WO 00/48749 | 8/2000 |
| WO | WO 01/31393 | 5/2001 |
| WO | WO 01/58989 | 8/2001 |
| WO | WO 01/96104 | 12/2001 |
| WO | WO 01/96115 | 12/2001 |
| WO | WO 2007/137102 | 11/2007 |
| WO | WO 2008/083304 | 7/2008 |
| WO | WO 2008/083308 | 7/2008 |
| WO | WO 2008/112451 | 9/2008 |

OTHER PUBLICATIONS

Affinito et al., "A New Technique for Fabrication of Nonlinear Optical Polymer Thin Films and a Cost Effective Fabrication Method for Nonlinear Optical Waveguides", FY97 Laboratory Directed Research and Development Proposal, (1997), pp. 1-4.

Affinito et al., "Comparison of Surface Treatments of PET and PML", SVC 40th Annual Technical Conference, Paper No. W-05, Proceedings of the Society of Vacuum Coaters, Vacuum Web Coating Session, (1997), (4 pages).

Affinito et al., "Electrochromic Oxides for Wide Area Switchable Camouflage, Windows, and Mirrors", FY97 IR&D Investment Proposal, Material Sciences Department/EMSL, (1997), pp. 1-6.

Affinito et al., "High Rate Vacuum Deposition of Polymer Electrolytes," J. Vac. Sci. Technol., A 14(3), (May/Jun. 1996), pp. 733-738.

Affinito et al., "Low Cost Wide Area Light Emitting Polymer Device Fabrication with PML and LML Process Technology", Battelle Pacific Northwest National Laboratory, (Aug. 1996), pp. 1-19.

Affinito et al., "Molecularly Doped Polymer Composite Films for Light Emitting Polymer Applications Fabricated by the PML Process", 41st Annual Technical Conference Proceedings (1998), pp. 220-225, Society of Vacuum Coaters.

Affinito et al., "PML/Oxide/PML Barrier Layer Performance Differences Arising From Use of UV or Electron Beam Polymerization of the PML Layers," Thin Solid Films, (1997), pp. 19-25, vol. 308-309, Elsevier Science S.A.

Affinito et al., "Polymer/Polymer, Polymer/Oxide, and Polymer/Metal Vacuum Deposited Interference Filters," Tenth International Vacuum Web Coating Conference, Battelle Pacific Northwest Laboratory, Nov. 10-12, 1996, pp. 0-14.

Affinito et al., "Polymer-Oxide Transparent Barrier Layers," 39th Annual Technical Conference Proceedings, (1996), pp. 392-397, Society of Vacuum Coaters.

Affinito et al., "Ultrahigh Rate, Wide Area, Plasma Polymerized Films From High Molecular Weight/Low Vapor Pressure Liquid or Solid Monomer Precursors", J. Vac. Sci. Technol., A 17 (4), Jul./Aug. 1999, pp. 1974-1981.

Affinito et al., "Vacuum Deposited Conductive Polymer Films", The Eleventh International Conference on Vacuum Web Coating, Nov. 9-11, 1997, pp. 201-212.

Affinito et al., "Vacuum Deposited Polymer/Metal Multilayer Films for Optical Application," Thin Solid Films, vol. 270 (1995), pp. 43-48.

Affinito et al., "Vacuum Deposition of Polymer Electrolytes on Flexible Substrates," Proceedings of the Ninth International Conference on Vacuum Web Coating, (1995), pp. 20-36, ed. R. Bakish, Bakish Press.

Affinito, "Addendum to Attached White Paper on Polymer Multilayer Thin Film Deposition Technology," Mar. 9, 1993, pp. 1-5.

Affinito, "Application of PNL,s PML Technology to Electrolyte and Advanced Battery Fabrication," Battelle Pacific Northwest Laboratories, Apr. 25, 1994, pp. 1-4.

Affinito, "Battelle Coating Capabilities and Experience," Battelle, Pacific Northwest Laboratories, (1994), (18 pages).

Affinito, "Extremely High Rate Deposition of Polymer Multilayer Optical Thin Film Materials," Battelle Pacific Northwest Laboratory, Jan. 4, 1991, (48 pages).

Affinito, "Li-Polymer Batteries Fabricated with New Materials and New Processing Technology, with Greater than 1200 WHr/l Capacity," Proposal Response to BAA 94-1, Battelle, Pacific Northwest Laboratory, Jan. 1994, pp. 1-21.

Affinito, "Using Lateral Force Microscopy as a Means to Obtain Information about Pinhole Formation in Al2O3 Barrier Layers Deposited on PET," May 5, 1997, (4 pages).

Affinito, "Vacuum Deposited Polymer/Silver Reflector Material", SPIE, (Jul. 1994), pp. 276-283, vol. 2262, Battelle, Pacific Northwest Laboratory, Materials Sciences Department.

Affinito, letter to Peter Erickson re: transmittal of literature, May 9, 1997, with an Affinito letter providing an overview of the content of the collection of literature concerning Battelle Pacific Northwest National Laboratory's PML and LML technology for the vacuum deposition of polymer films, May 5, 1997, (4 pages).

Allen et al., Building Etch Resistance Into a High Resolution Imaging System, Proc. SPIE 2438, 474 (1995).

Allen et al., High Performance Acrylic Polymers and Chemically Amplified Photoresist Applicatiions, J. Vac Sci. Technol. B, 9, 3557 (1991).

Baouchi et al., "Comparison of Non-Reactive and Reactive ITO Sputtering in a High Volume Production Environment", Donnelly Applied Films Corporation, SID 1995 Conference, pp. 89-90.

Barnes et al., "Advanced Materials for Electronic Applications by Polymerization of Cyclic Olefins Using Late Transition Metal Catalysts," (Jun. 10-1, 1998), pp. 1-13.

Beringer et al., Diaryliodonium Salts. IX. The Synthesis of Substituted Diphenyliodium Salts, J. Am.Chem Soc. 81, 342-351 (1959).

Blocher, Jr., Chapter 8, "Chemical Vapor Deposition", Deposition Technologies for Films and Coatings, Developments and Applications, (1982), pp. 335-364, Noyes Publications, New Jersey.

Bonifield, Chapter 9, "Plasma Assisted Chemical Vapor Deposition", Deposition Technologies for Films and Coatings, Developments and Applications, (1982), pp. 365-384, Noyes Publications, New Jersey.

Bright et al., "Transparent and Conductive Ultra-Barrier Coatings for Flexible Plastic Display", Delta V Technologies, Inc., American Vacuum Society 46th International Symposium, Seattle, WA, (Oct. 25-29, 1999), (20 pages).

Bright et al., "Transparent Barrier Coatings Based on ITO for Flexible Plastic Displays", (1999), Delta V Technologies, Inc., (18 pages).

Bright, Society of Vacuum Coaters Short Course on "Deposition and Properties of ITO and Other Transparent Conductive Coatings" (Supplementary Notes), (1998), Delta V Technologies, Inc., (37 pages).

Bright, Society of Vacuum Coaters Short Course on "Deposition and Properties of ITO and Other Transparent Conductive Coatings", (1996), Delta V Technologies, Inc., (123 pages).

Cairns et al., "Strain-dependent electrical resistance of tin-doped indium oxide on polymer substrates", Applied Physics Letters, vol. 76, No. 11, Mar. 13, 2000, pp. 425-427.

Chahroudi et al., "Transparent Glass Barrier Coating for Flexible Film Packaging", Society of Vacuum Coaters 505/298-7624, 34th Annual Technical Conference Proceedings (1991), pp. 130-133.

Chatham, "Review Oxygen Diffusion Barrier Properties of Transparent Oxide Coatings on Polymeric Substrates," Surface & Coatings Technology (1996), pp. 1-9, vol. 78.

Comer, "The Impact of Visual Anomalies on the Barrier Properties of Metallized Biaxially Oriented Polypropylene Film," (1995), 38th Annual Technical Conference Proceedings, Society of Vacuum Coaters 505/856-7188, pp. 59-60.

da Silva Sobrinho et al., "Transparent Barrier Coatings on Polyethylene Terephthalate by Single-and Dual-Frequency Plasma-Enhanced Chemical Vapor Deposition," J. Vac. Sci. Technol., A 16(6), Nov./Dec. 1998, pp. 3190-3198.

Deshpandey et al., "Evaporation Processes", Thin Film Processes II, Academic Press, Inc., Chapter II-2, (1991), pp. 79-132.

Gilbert et al., "Comparison of ITO Sputtering Process from Ceramic and Alloy Targets onto Room Temperature PET Substrates," Society of Vacuum Coaters, 36th Annual Technical Conference Proceedings, (1993), pp. 236-241.

Gustafsson et al., "Flexible Light-Emitting Diodes Made From Soluble Conducting Polymers," Nature, vol. 357, Jun. 11, 1992, pp. 477-479.

Han et al., "Improved conductivity and mechanism of carrier transport in zinc oxide with embedded silver layer", Journal of Applied Physics 103, (2008).

Heil, "Mechanical Properties of PECVD Silicon-Oxide Based Barrier Films on PET," (1995), 38th Annual Technical Conference Proceedings, Society of Vacuum Coaters, 505/856-7188, p. 33.

Hollahan et al., "Plasma Deposition of Inorganic Thin Films," Thin Film Processes, Academic Press, Chapter IV-1, (1978), pp. 335-360.

Inoue et al., "Fabrication of a Thin Film of MNA by Vapour Deposition," (1990), pp. 177-179, The 33rd Japan Congress on Materials Research.

Johnson, "The Cathodic Arc Plasma Deposition of Thin Films", Thin Film Processes II, Academic Press, Inc., Chapter II-5, (1991), pp. 209-280.

King, "Defrosting of Automobile Windshields Using High Light Transmitting Electro Conducting Films", Society of Automotive Engineers, 1974, pp. 1-5.

Knoll et al., "Effects of Process Parameters on PECVD Silicon Oxide and Aluminum Oxide Barrier Films," (1995), 38th Annual Technical Conference Proceedings, Society of Vacuum Coaters 505/856-7188, pp. 425-426 and 430.

Langowski, "Transparent Barrier Coatings for Flexible Packagings: Industrial and Research Activities in Germany," (1996), 39th Annual Technical Conference Proceedings, Society of Vacuum Coaters 505/856-7188, pp. 398 and 415.

Lee et al., Handbook of Epoxy Resins, McGraw-Hill Book Co., NY (1967).

Lewis et al., "Highly flexible transparent electrodes for organic light-emitting diode-based displays", Applied Physics Letters, vol. 85, No. 16, Oct. 18, 2004, pp. 3450-3452.

Lohwasser et al., "Electron-Beam Oxide Coating on Plastic Films for Packaging, Development, Production and Application," (1995), 38th Annual Technical Conference Proceedings, Society of Vacuum Coater 505/856-7188, pp. 40-41.

Macleod, "Antireflection Coatings", Thin-Film Optical Filters, Macmillan Publishing Co., Second Edition, (1986), pp. 71-136.

Mahon et al., "Requirements of Flexible Substrates for Organic Light Emitting Devices in Flat Panel Display Applications", 42nd Annual Technical Conference Proceedings, (1999), pp. 456-459, Society of Vacuum Coaters 505/856-7188.

Mattox, Chapter 6, "Ion Plating Technology", Deposition Technologies for Films and Coatings, Developments and Applications, (1982), pp. 244-287, Noyes Publications, New Jersey.

McGraw-Hill Multimedia Encyclopedia of Science & Technology, "Electroluminescence," (1998), pp. 1-3.

McGraw-Hill Multimedia Encyclopedia of Science & Technology, "Electronic Display," (1998), pp. 1-8.

McGraw-Hill Multimedia Encyclopedia of Science & Technology, "Light-Emitting Diode," (1998), pp. 1-3.

McGraw-Hill Multimedia Encyclopedia of Science & Technology, "Liquid Crystals," (1998), pp. 1-5.

McGraw-Hill Multimedia Encyclopedia of Science & Technology, "Printed Circuit," (1998), pp. 1-13.

McGraw-Hill Multimedia Encyclopedia of Science & Technology, "Sputtering," (1998), pp. 1-3.

Misiano et al., "Inexpensive Transparent Barrier Coatings on Plastic Substrates," (1996), 39th Annual Technical Conference Proceedings, Society of Vacuum Coaters 505/856-7188, pp. 413 and 399.

O'Mara, "Liquid Crystal Flat Panel Displays, Manufacturing Science & Technology", (1993), Van Nostrand Reinhold Publishing, New York, pp. 21-35, 66-70, 73, 93, 96, 116-117, 123-125, 144-145, 149-150, and 165-175.

Parsons, "Sputter Deposition Processes", Thin Film Processes II, Academic Press, Inc., Chapter II-4, (1991), pp. 177-207.

Penning, "Electrical Discharges in Gases, Gordon and Breach", Science Publishers, (1965), Chapters V-VI, pp. 19-35; and Chapter VIII, pp. 41-50.

Reif, "Plasma-Enhanced Chemical Vapor Deposition", Thin Film Processes II, Academic Press, Inc., Chapter IV-1, (1991), pp. 525-564.

Sahu et al., "High quality transparent conductive ZnO/Ag/ZnO multilayer films deposited at room temperature", Thin Solid Films 515 (2006), pp. 876-879.

Sahu et al., "Study on the electrical and optical properties of Ag/Al-doped ZnO coatings deposited by electron beam evaporation", Applied Science 253 (2007), pp. 4886-4890.

Sahu et al., "ZnO/Ag/ZnO multilayer films for the application of a very low resistance transparent electrode", Applied Surface Science 252 (2006), pp. 7509-7514.

Shaw et al., "A New High Speed Process for Vapor Depositing Acrylate Thin Films: An Update," Society of Vacuum Coaters 36th Annual Technical Conference (1993), pp. 348-352.

Shaw et al., "A New Vapor Deposition Process for Coating Paper and Polymer Webs," Catalina Coatings, Inc., (1992), pp. 96-102.

Shaw et al., "Use of Evaporated Acrylate Coatings to Smooth the Surface of Polyester and Polypropylene Film Substrates," Rad Tech (1996), (12 pages).

Shaw et al., "Use of Vapor Deposited Acrylate Coatings to Improve the Barrier Properties of Metallized Film," Society of Vacuum Coaters 37th Annual Technical Conference (1994), pp. 240-244.

Shi et al., "Plasma Treatment of PET and Acrylic Coating Surfaces: I. In-Situ XPS Measurements", Journal of Adhesion Science and Technology, vol. 14, No. 12, (2000), pp. 1485-1498.

Shi et al., "In-Situ and Real-Time Monitoring of Plasma-Induced Etching of PET and Acrylic Films", Plasmas and Polymers, vol. 4, No. 4, (1999), pp. 247-258.

Thornton, Chapter 5, "Coating Deposition by Sputtering", Deposition Technologies for Films and Coatings, Developments and Applications, (1982), pp. 170-243, Noyes Publications, New Jersey.

Tropsha et al., "Activated Rate Theory Treatment of Oxygen and Water Transport Through Silicon Oxide/Poly(ethylene terephthalate) Composite Barrier Structures", J. Phys. Chem. B, vol. 101, No. 13, (1997), pp. 2259-2266.

Tropsha et al., "Combinatorial Barrier Effect of the Multilayer SiOx Coatings on Polymer Substrates", Society of Vacuum Coaters, 40th Annual Technical Conference Proceedings (1997), pp. 64-69.

Vossen et al., "Glow Discharge Sputter Deposition," Thin Film Processes, Academic Press, Inc., Chapter 11-1, (1978), pp. 12-73.

Yamada et al., "The Properties of a New Transparent and Colorless Barrier Film," (1995), 38th Annual Technical Conference Proceedings, Society of Vacuum Coaters, pp. 28-29.

Yasuda, "Glow Discharge Polymerization", Thin Film Processes, Academic Press, Inc., Chapter IV-2, (1978), pp. 361-398.

\* cited by examiner

TRANSPARENT CONDUCTIVE ARTICLES AND METHODS OF MAKING SAME

CROSS-REFERENCE TO RELATED APPLICATIONS

This application is a continuation of U.S. application Ser. No. 12/964,909, filed Dec. 10, 2010, now U.S. Pat. No. 8,241,752 now allowed, which is a continuation of U.S. application Ser. No. 11/859,581, filed Sep. 21, 2007, now abandoned, which is a divisional of U.S. application Ser. No. 10/317,623, filed Dec. 12, 2002, issued as U.S. Pat. No. 7,276,291, which is a continuation of U.S. application Ser. No. 09/939,008, filed Aug. 24, 2001, issued as U.S. Pat. No. 7,186,465, which is a divisional of U.S. application Ser. No. 09/419,870, filed Oct. 18, 1999, now abandoned, which claims the benefit of U.S. Provisional Application No. 60/106,871, filed Nov. 2, 1998, the disclosure of which is incorporated by reference in their entirety herein, including the original specification, first substitute specification, second substitute specification, and all attached Appendices of U.S. application Ser. No. 09/419,870.

TECHNICAL FIELD

This invention relates to composite substrates for flat panel displays (FPD), packaging materials and light sources (electro luminescence lamps) comprising a plastic substrate having thin film barrier and conductive layers, in particular, multiple thin alternating layers of metallic film, transparent conductive oxide (TCO), metal nitride, and organic polymers deposited over the plastic substrate.

BACKGROUND

The use of portable electronic devices incorporating flat panel displays is prevalent and increasing rapidly. Because of the portable nature of these devices, it is desired to minimize both the size and weight and maximize durability. The display portion of the device is generally larger and denser as compared to the rest of the device, and is manufactured on glass substrates. Accordingly, a smaller, lighter and more durable portable electronic device is most effectively achieved with a smaller, lighter and shatterproof electronic device display.

Despite having lightweight, plastic has not been considered a viable substrate material to be used for the manufacture of flat panel displays for multiple reasons. Most importantly, flat panel displays fabricated with plastic substrates tend to fail prematurely due to degradation of display medium (display matrix) and/or metallic electrodes. In particular, the metallic electrodes and the display medium which is often positioned between the electrodes, become degraded when atmospheric oxygen and water vapor permeate the substrate and chemically degrade the active portion of the display matrix which is generally comprised of liquid crystals and/or light emitting devices. In addition, common optical quality plastic substrates, e.g. polyethylene terephthalate (PET), have limited thermal properties. In particular, there is a limited temperature range that allows useful optical quality (e.g. clarity, transparency, and uniform index of refraction) to be maintained, while maintaining the substrate's mechanical strength and properties.

SUMMARY

The present invention is directed to the fabrication of flat panel displays on lightweight, flexible, plastic substrates. Because plastic substrates for FPDs are flexible, smaller and lighter than glass substrates, the electronic device with the plastic FPD is more portable, space-efficient and lightweight. In addition, electroluminescent and organic light emitting devices fabricated on flexible polymeric substrates in a coating process have lower manufacturing costs than those with glass substrates, and improved ruggedness.

A display medium of the flat panel display is sandwiched between two electrode layers. At least one of the electrodes is transparent for viewing of the display. The display medium is protected from oxidative or moisture degradation. In the present invention, at least one layer, having both barrier characteristics and the ability to function as an electrode, is deposited over the substrate. In particular, the layer has both low oxygen and water vapor permeability, and a low enough resistivity to function as an electrode for the display. For lower permeability and/or higher conductivity, multiple alternating layers of barrier materials and conductive materials are applied. In an alternative embodiment, the conductive layers (e.g. transparent conductive oxide layers) are in direct electrical contact. The barrier material includes at least one of an organic polymer, a transparent dielectric, a transparent metal nitride and/or a transparent conductive oxide. The conductive material includes at least one of a thin transparent conductive oxide, a thin transparent metallic film and/or a metal nitride.

Using a smoothing base coat layer over the plastic substrate imparts good optical quality throughout the substrate layers and provides a pristine surface for nucleation of the deposited barrier or conductive layer, e.g. TCO. The pristine surface smoothes over any surface roughness of the plastic substrate, thereby adding to the FPD lifetime and optical quality. Additionally, a hardcoat layer is applied over the substrate in lieu of or in addition to the smoothing basecoat layer.

The smoothing basecoat and hardcoat layers may be applied by one of many well known non-vacuum liquid coating processes, e.g. preferably by Gravure, or fabricated through a polymer multilayer (PML) coating process. Related desirable coating processes are disclosed in U.S. Pat. Nos. 5,547,508, 5,395,644, 5,260,095, 6,224,948, herein incorporated by reference, *Thin Film Processes II*, chapters II-2, 4, 5, and IV-1, edited by John L. Vossen and Wermer Kern, Academic Press, 1991, ISBN 0-12-728251-3, and *Deposition Technologies for Films and Coatings, Developments and Applications*, Rointan F. Bunshah et al., Chapters 5, 6, 8 and 9, Noyes Publications, 1982, ISBN 0-8155-0906-5.

The terms PML and PML process as used in this application are generic and mean any form of a PML process, including Plasma PML processes (PPML processes) and liquid PML processes (LML processes). The basic vacuum evaporation PML process is used to deposit organic monomers over the plastic substrate. The organic monomer is then polymerized in-situ by electron beam, a plasma process, or UV radiation.

The PML process is compatible with physical vapor deposition processes for layers such as TCO layers. Both processes are carried out in combined sequences within a properly designed single vacuum chamber. However, often multiple vacuum chambers are used, for example, if a substrate is hardcoated previously.

The PML deposited organic polymer layer is used to produce substrate surface smoothing and improve barrier coatings in the multilayer structure. The benefit of a smooth substrate surface is that there is a clean surface for adhesion, nucleation, and growth of a deposited barrier or conductive layer, e.g. a TCO. Additionally, a PML deposited organic polymer layer provides protection of an underlying barrier layer in order to minimize holes or other defects in the layer so that there is low permeability.

Neither a single layer barrier coating with a metal oxide layer such as thin film dielectric coatings of alumina or silica or other certain metal oxides, nor a plastic flat panel display with a thick metallic film layer having an optical density of greater than 2.0 renders low enough permeability for the processing and manufacture of plastic flat panel displays with acceptable lifetimes. Even where a single thick layer or multiple thin layers of dielectrics, metals or the combination thereof are used, the improvement in performance is minimal. In order to provide barrier properties sufficient for optical quality plastic flat panel displays, a transparent dielectric barrier, such as $SiO_{2-x}$ or $Al_2O_{3-y}$, is deposited over a plastic substrate. When dielectric layers are combined with PML deposited organic polymer layers, outstanding barrier properties are achieved on flexible plastic substrates. Alternatively to the dielectric layer, a barrier coating of ITO (called "indium tin oxide", which is actually "Tin doped indium oxide", a mixture of indium oxide and tin oxide) or another TCO barrier is deposited over the substrate. In yet another alternative embodiment, both TCO barrier layers and PML processed organic polymer layers are deposited over the plastic substrate. Moreover, in yet another alternative, both TCO barrier layers with PML processed organic polymer layers and the transparent dielectric barrier layers are deposited over the plastic or polymeric substrate. Multilayer structures of such organic and inorganic layers deposited over a plastic substrate exhibit significantly improved barrier properties as compared to inorganic, organic, or metallic layers alone.

In an embodiment, a PML processed top coat polymer layer is applied before the previously deposited layer contacts a surface, such as a roller, thereby protecting the previously deposited layer. The PML processed top coat greatly enhances the exclusion of moisture (water vapor) and atmospheric gases that chemically degrade the display medium and decrease the device performance, even though the polymer topcoat is not, itself, a good barrier material.

Metal oxide dielectric barriers have previously been deposited by evaporation, sputtering, and chemical vapor deposition processes onto glass substrates. However, for achieving metal oxide thin films with bulk material-like properties on glass substrates, a high temperature deposition method is used, which would melt the plastic substrate, thereby negatively impacting the mechanical properties of the plastic substrate. In the present invention, the PML family of processes used for depositing an organic dielectric does not require such high temperatures and therefore does not significantly alter the mechanical properties of the plastic substrate. However, organic polymer layers alone do not provide substantial barrier properties, particularly against water vapor.

When TCOs are deposited at low temperatures to accommodate the thermal and mechanical limits of the substrate, for example, by magnetron sputtering, electron-beam evaporation or plasma enhanced chemical vapor deposition (PECVD), the subsequent TCO coatings have less than bulk conductivity, i.e. low overall levels of conductivity. TCO films with a larger thickness deposited through these methods achieve acceptable conductive levels for portable electronic devices. However, these thick films of TCO are subject to cracking, crazing and, in some instances, delamination from the substrate, especially when they are processed by a heat treatment step or a coating process involving mechanical rollers (e.g. web coating). Accordingly, the TCO coating is deposited in a series of thin, separated layers, yet still maintains high conductive levels. Multiple thin layers of TCO avoid the problems associated with thicker layers, and advantageously are electrically connected in parallel to provide adequate electrical performance characteristics.

The thin layers of TCO are preferably deposited in combination with layers from the PML process, which leads to improved optical, electrical and mechanical performance. In particular, the polymer layers separate the TCO layers. Superior surface properties (low surface roughness, and high optical quality), barrier properties (low vapor permeability) and mechanical properties result when TCO coatings are deposited by magnetron sputtering on a plastic substrate in combination with the PML process.

Preferably, moderate annealing temperature conditions, with respect to substrate limits, are used for TCO (including ITO, "tin doped indium oxide") deposition because high temperature conditions result in melting of the plastic, and low temperature conditions yields ITO layers with undesirable high resistivity. (The resistivity of ITO is a function of the oxygen and tin content, as well as the deposition conditions, such as temperature). A low resistivity for the ITO layers is desired. The resistivity of ITO decreases with a thicker TCO layer. But as discussed previously, thick TCO layers are prone to cracking or crazing. Multiple thin layers of TCO, as described in the present invention, will not crack and will yield a lower resistivity. Moreover, the surface resistivity of a thin film of TCO in multiple layers is low for a given total film thickness, due to its improved microstructure.

In a first embodiment of the present invention, a polymer smoothing coating is deposited over the substrate. The smoothing coating is applied by a PML process or liquid coating. A TCO, metal nitride, or metal layer is then deposited over the smoothing layer. Additionally, multiple alternating layers of a protective polymer layer and an additional TCO, metal nitride, or metal layer is deposited. Preferably, the alternating layers are of the same material, e.g. TCO/polymer/TCO, etc.

In a second embodiment, multiple alternating layers of polymer layers and metal oxide or metal nitride are deposited over the substrate or a polymer smoothing coating layer. A TCO layer is then deposited over the top of multiple alternating layers. These multiple alternating layers together with the TCO have adequate barrier and conductivity characteristics.

In a third embodiment, a substrate is coated with a TCO layer, a metal coating, and another TCO layer. This three layer configuration is called "optically enhanced metal," or an induced transmission filter and has similar characteristics as and is substitutable for a single TCO layer. With the optically enhanced metal good conductivity, optical transmission and barrier properties are achieved. A similar structure using metal nitrides substituted for the metal coating or the TCO layer, or one or more metal oxide layers substituted for one or more TCO layers, functions equivalently to the optically enhanced metal. For example, a further embodiment is comprised of a TCO layer, a conductive metal nitride layer and another TCO layer. Alternatively, the structure is a silicon nitride layer, a metal layer and another metal nitride layer.

In a fourth embodiment, a substrate is alternatively coated with an inorganic layer (such as TCO, metal nitride, or dielectric metal oxides), and-polymer layers to provide both barrier and conductive properties.

BRIEF DESCRIPTION OF THE DRAWINGS

The aspects of the present invention described above in summary and below in more detail as well as various advantageous aspects will become appreciated as the same becomes better understood with reference to the specification, claims and drawings wherein:

FIG. 14$b$ is a cross-sectional view of the FPD before undergoing a bonding process;

FIG. 14$c$ is a cross-sectional view of the FPD after undergoing a bonding process;

DETAILED DESCRIPTION

Figure 1:
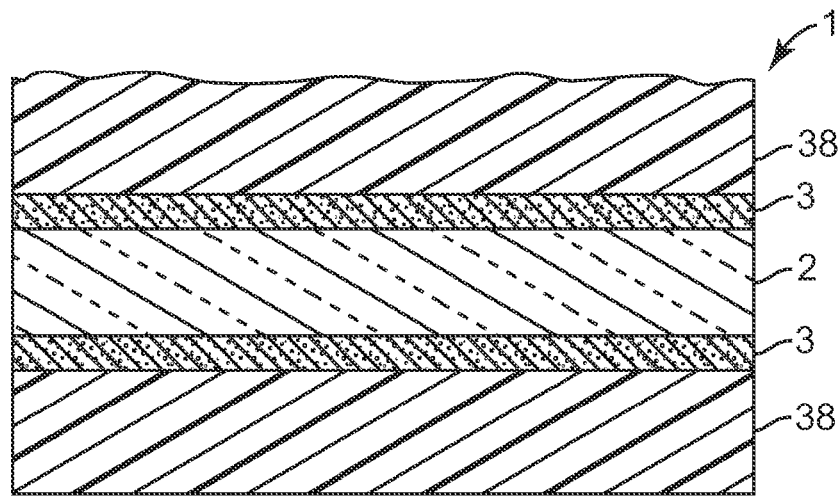
FIG. 1 is a cross-sectional view of a composite substrate for a flat panel display (FPD) of the present invention.

A flat panel display (FPD) 1, of the present invention as shown in FIG. 1, employs at least one lightweight, plastic substrate 38 for fabricating FPDs. In one embodiment, the plastic is flexible. In another embodiment, the substrate used in the flat panel display is glass. In an alternative embodiment, there are two plastic substrates used to construct the FPD. In between two substrates of the flat panel display are at least two electrodes. At least one of the electrodes is transparent for viewing of the display. A display medium 2 for the flat panel display is usually positioned between the two electrodes. The display medium, as well as some electrode material, is protected from oxidative degradation and reaction with or incorporation of moisture.

The displays are fabricated using plastic substrates such as various polyolefins, e.g. polypropylene (PP), various polyesters, e.g. polyethylene terephthalate (PET), polymethylmethacrylate (PMMA) and other polymers such as polyethylene napthalate (PEN), polyethersulphone (PES), polyestercarbonate (PC), polyetherimide (PEI), polyarylate (PAR), polyimide (PI), and polymers with trade names ARTON® (Japanese Synthetic Rubber Co., Tokyo, Japan) and AVATREL™ (B.F. Goodrich, Brecksville, Ohio). See Appendix A for deposition temperature capabilities of the particular plastic substrate.

Figure 6:
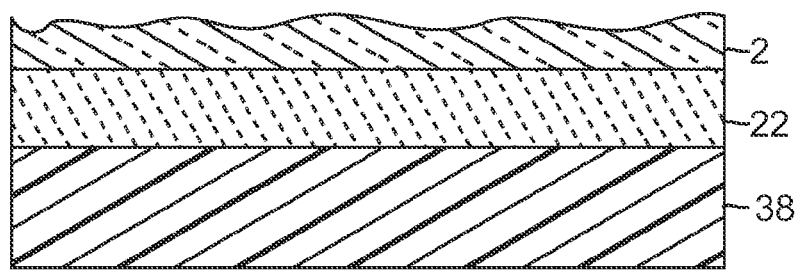
FIG. 6 is a cross-sectional view of an embodiment of a conductive barrier layer.

In the present invention, at least one layer, a conductive barrier layer 3 has both barrier characteristics (to protect the display medium and/or the metal electrode from oxidative degradation and reaction with or incorporation of moisture) and the ability to function as an electrode. The conductive barrier layer is deposited over the substrate to form a composite substrate, as shown in FIG. 6. In particular, layer 3 has both low oxygen and moisture (water vapor) permeability, and a low enough resistivity to function as an electrode for the display.

Figure 2:
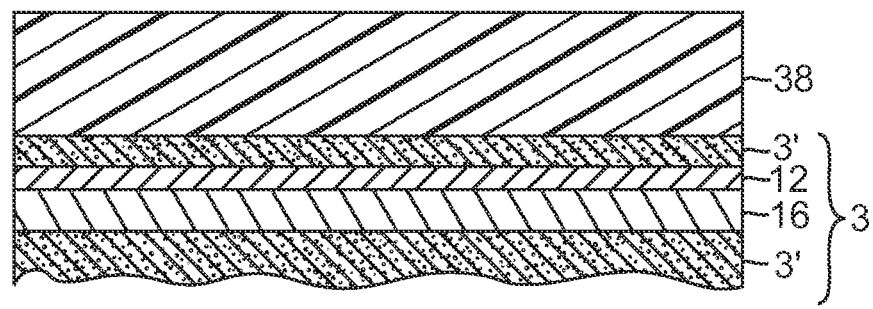
FIG. 2 is a cross-sectional view of another embodiment of conductive barrier layer 3 of FIG. 1.
Figure 3:
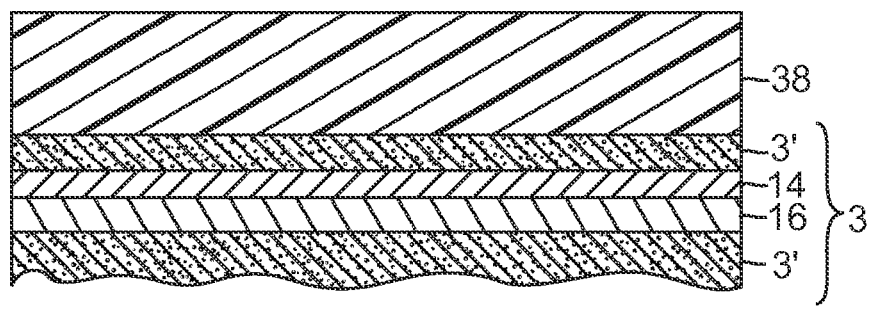
FIG. 3 is a cross-sectional view of another embodiment of conductive barrier layer 3 of FIG. 1.
Figure 4:
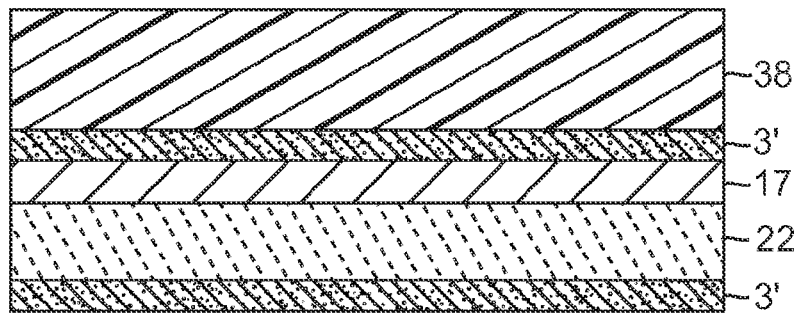
FIG. 4 is a cross-sectional view of another embodiment of conductive barrier layer 3.
Figure 5:
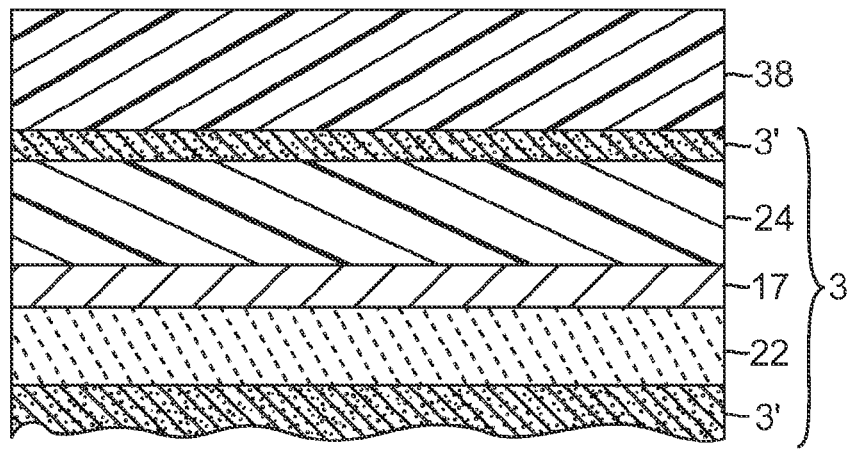
FIG. 5 is a cross-sectional view of another embodiment of conductive barrier layer 3 of FIG. 1.

As shown in the general embodiments of FIGS. 2 through 5, conductive barrier layer 3 comprises at least one sublayer $3^1$ deposited over the substrate, for instance a single ITO layer. In an embodiment, at least one pair of sublayers, a dyad, of a polymer layer 24 and a layer of TCO 22, metal 12, metal nitride 14 or metal oxide 16, is deposited over the substrate. FIG. 2 illustrates the sublayer having a dyad of metal 12 and metal oxide 16. FIG. 3 illustrates the sublayer having a dyad of metal nitride 14 and metal oxide 16. FIG. 4 illustrates the sublayer having a dyad of dielectric 17 and TCO 22. FIG. 5 illustrates the TCO layer 22 deposited over the dielectric layer 17 which is deposited over the polymer layer 24. The sublayers $3^1$ deposited on either side of the pairs illustrated in FIGS. 2-4 are, for example, a single ITO layer, additional dyads of the same materials, and/or a polymer coating. In an exemplary embodiment, multiple alternating sublayer pairs, comprised of the same materials as the original sublayer pair, are deposited over the substrate or over the previously deposited sublayer. In another embodiment the multiple alternating sublayer pairs deposited over the previously deposited sublayer comprise different sublayer materials than the previously deposited sublayer.

There are a myriad of possibilities for materials comprising the sublayers of the conductive barrier layer. FIGS. 2-5 illustrate generally only some of the more preferred embodiments of sublayer $3^1$ materials for conductive barrier layer 3, while FIGS. 7-12 illustrate particularly the more preferred embodiments for the conductive barrier layer.

Figure 9:
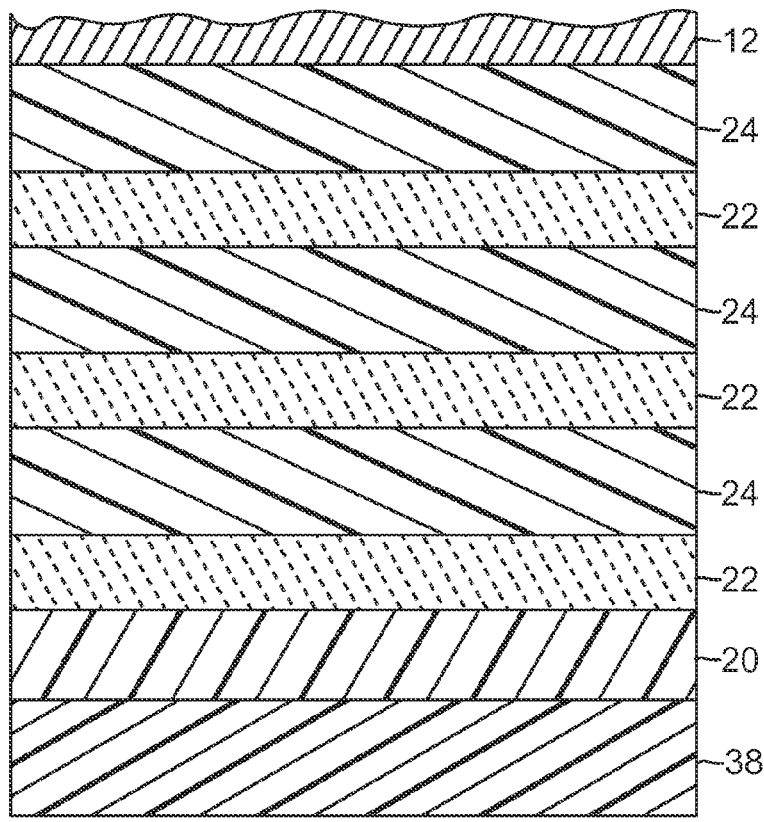
FIG. 9 is a cross-sectional view of an embodiment of conductive barrier layers of FIG. 1.
Figure 10:
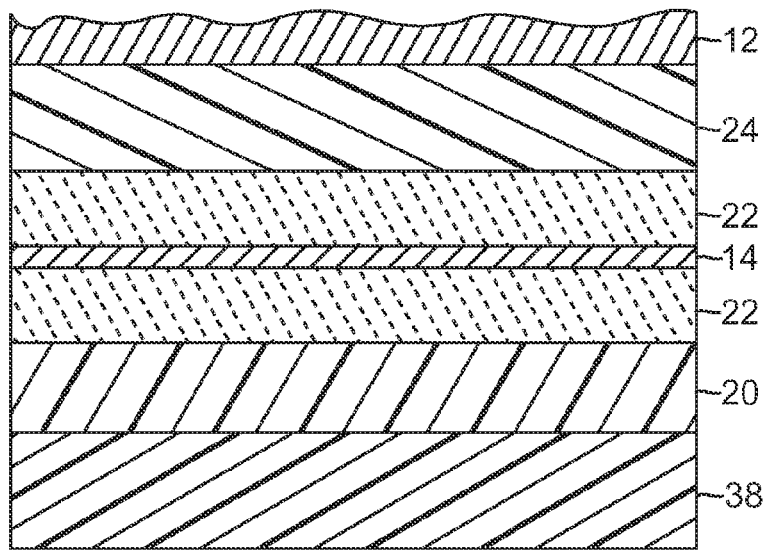
FIG. 10 is a cross-sectional view of an embodiment of conductive barrier layers of FIG. 1.

In one embodiment shown in FIG. 9, for example, a base coating 20 is deposited over the substrate 38. The base coating is a polymer smoothing coating applied by a PML process and/or an organic hardcoat. The base coating can be deposited by a non-vacuum liquid coating process (to render a hardcoated PET) or applied by a PML process. When a hardcoat is deposited, the plastic substrate is rendered abrasion resistant. A TCO layer 22 (or metal layer 12) is then deposited over the base coat. In another embodiment, multiple alternating layers of a protective polymer layer 24 and at least one TCO layer 22 (or metal layer 12) are additionally deposited (see FIG. 9). Preferably, the alternating layers additionally deposited are of the same material, e.g. TCO/polymer/TCO, etc. Alternatively, there is no base coat 20 for the embodiment of alternating layers of polymer/TCO/polymer (not shown). In another embodiment, also shown in FIG. 9, a metal conductor or reflector 12 overlays the top polymer layer 24.

Figure 7:
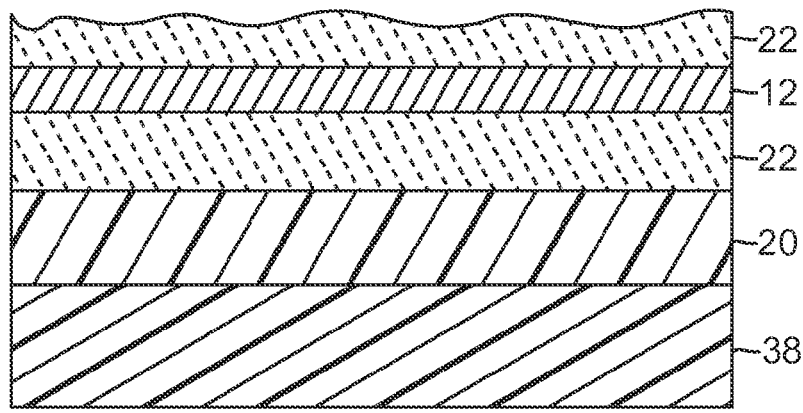
FIG. 7 is a cross-sectional view of an embodiment of conductive barrier layers of FIG. 1.
Figure 8:
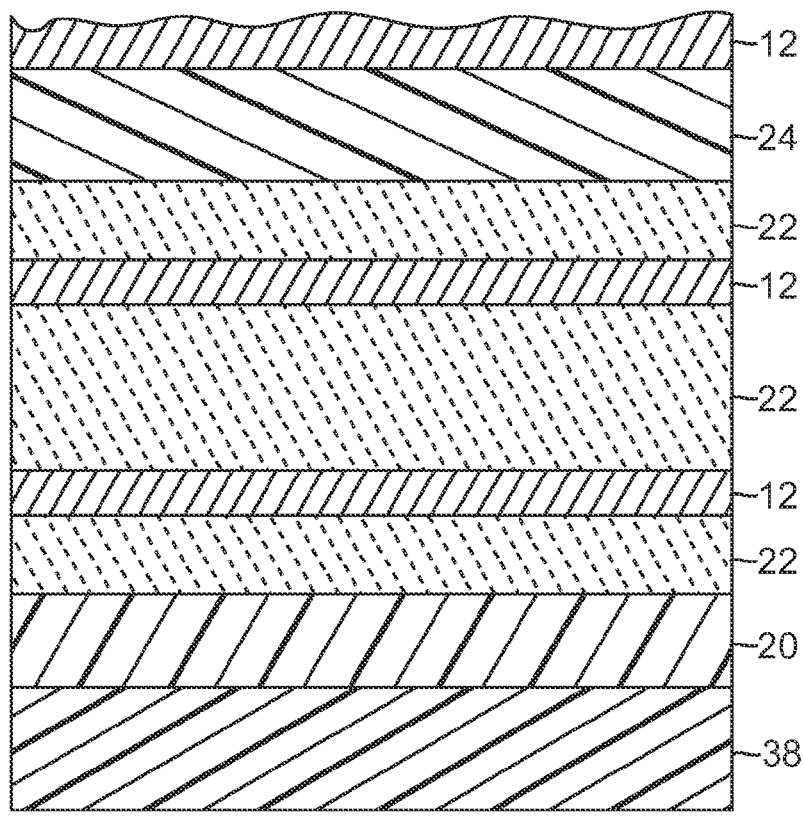
FIG. 8 is a cross-sectional view of an embodiment of conductive barrier layers of FIG. 1.

In the embodiment shown in FIG. 7, a substrate is coated with a TCO layer, a metal coating, and another TCO layer. This three layer configuration is called an "optically enhanced metal", or "induced transmission filter" and has characteristics similar to a single TCO layer, and is also substitutable for a single TCO layer. With the optically enhanced metal, good conductivity, transmission and barrier properties are achieved. In a preferred embodiment, deposited on the three layers is polymer layer 24 (see FIG. 8). The polymer layer 24 may be alternating with the optically enhanced metal (not shown). Alternatively, base coat 20 is deposited over the substrate as shown in FIG. 7. Additionally or alternatively, another dyad (a metal and TCO pair) is deposited over the top TCO layer and/or an additional polymer layer 24 (a polymer overcoat) is deposited over the previously deposited dyad (see FIG. 8). In another alternative, a thick metal layer 12 is deposited over the polymer overcoat layer, as also shown in FIG. 8. Alternatively, the metal nitride layer 14 is substituted for one or more of the metal layers in the above described embodiments, for example, see FIGS. 10 and 11.

In still another embodiment, the substrate is alternatively coated with an inorganic layer (such as the TCO layer or the dielectric metal oxide layer), and polymer layers to provide both barrier and conductive properties.

Figure 12:
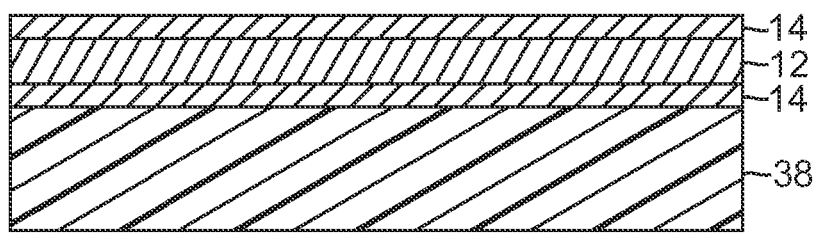
FIG. 12 is a cross-sectional view of an embodiment of conductive barrier layers.

FIG. 12 illustrates metal layer 12 sandwiched between two metal nitride layers 14. Alternatively, additional dyads (metal and metal nitride pair) are deposited over the metal nitride layer. Further embodiments of this dyad pair are similar to the TCO/metal dyad pair embodiments of FIGS. 7-8, i.e. the TCO layers of FIGS. 7-8 are replaced by one or more metal nitride layers.

In another alternative embodiment, the dielectric layer replaces one or more TCO layers in the above described embodiments (see generally FIGS. 4 and 5). As shown in FIG. 5, multiple alternating layers of dielectric 17 and polymer layers 24 are deposited over the substrate 38. The number of multiple alternating layers (or dyads) may vary, and is represented here by $3^1$, sublayers of the conductive barrier layer 3.

A TCO layer 22 (or metal layer 12) is then deposited over the top of multiple alternating layers. These multiple alternating layers together with the TCO have adequate barrier and conductivity characteristics as described in more detail below.

Each TCO layer 22 of the above embodiments is a single TCO layer. Alternatively, the TCO layers in the Figures described above represents the thickness of two TCO layers from adjacent layers of "optically enhanced metal" of FIG. 8 or the metal nitride alternative of FIG. 11.

Preferably, the metal layers that are in the alternating dyad pairs or in between the TCO, metal nitride, or dielectric layers, are thin. The metal layers that are adjacent the "display medium", i.e. overlaying the dyad layers, or on the substrate, have a greater thickness than the sandwiched metal layers.

Sublayer $3^1$ materials that provide transparent barrier properties are thin transparent metal oxides 16, and/or thin transparent metallic films 12, and/or thin metal nitrides 14, for example silicon nitride, and aluminum nitride. The polymer layer 24 enhances barrier properties by reducing the number of holes and defects in the films upon which or under which, they are deposited. The metal oxide layer 16 comprises the dielectric layer 17 and/or the transparent conductive oxide layer 22. Thicknesses for the barrier layers are in the nanometer and angstrom range. Thicknesses for the PML deposited layers are in the micron and submicron range. For example, improved barrier coating occurs when a PML deposited organic polymer layer (a base coat), and/or a metal oxide layer is placed over the plastic substrate. See Table 2.

Sublayer $3^1$ materials that provide conductive properties include the thin TCO layer 22, a thin transparent metallic film layer 12 (such as aluminum, silver, copper, gold, platinum, palladium, and alloys thereof), and the metal nitride layer 14 (such as transition metal nitrides, for example, titanium nitride, zirconium nitride, hafnium nitride, and nitrides of Group IIIA and IVA elements of the Periodic Table, e.g. gallium nitride). Thicknesses for the conductive layers are in the nanometer and angstrom range. Preferably the conductive film (TCO) is formed by multiple thin conductive layers (of TCO) separated by polymer layers. The conductive (TCO) layers are deposited with electrical contact to each other, so that a low resistivity is achieved. Consequently, the conductive film (TCO) functions as both the electrode and a barrier.

In the preferred embodiment, the PML processed base coat 20 is deposited over the substrate as shown in FIG. 9. The base coat produces substrate smoothing, and more importantly, in combination with other layers, the base coat has surprisingly effective vapor barrier enhancement properties because of the smoothing and protection characteristics. The sublayers are preferably deposited in combination with the process illustrated in FIG. 13, as described below.

Using the smoothing base coat layer over the plastic substrate imparts good optical and barrier quality throughout the substrate layers and provides a pristine surface for nucleation of the deposited TCO electrode layer. The basecoat smoothes over any surface roughness of the plastic substrate, thereby adding to the FPD lifetime and optical quality.

In an exemplary embodiment, one or more metal oxide layers are replaced with the TCO layer. When TCO coatings, including ITO ("Tin doped indium oxide"), cadmium oxides ($CdSn_2O_4$, $CdGa_2O_4$, $CdIn_2O_4$, $CdSb_2O_6$, $CdGeO_4$, tin oxides (various alloys and dopants thereof), indium oxides ($In_2O_3$: Ga, $GaInO_3$ (Sn, Ge), $(GaIn)_2O_3$), zinc oxides (ZnO (Al), ZnO(Ga), $ZnSnO_3$, $Zn_2SnO_4$, $Zn_2In_2O_5$, $Zn_3In_2O_6$), and/or magnesium oxides ($MgIn_2O_4$, $MgIn_2O_4$—$Zn_2In_2O_5$) are deposited on the plastic substrate at a low temperature, they have an amorphous microstructure. For characteristics of the above TCO materials, see Table A.

TABLE A

EMERGING TRANSPARENT CONDUCTING OXIDES FOR ELECTRO-OPTICAL
APPLICATIONS CHARACTERISTICS OF EMERGING TCO MATERIALS

| Material | Transmittance (%) | Resistivity ($\times 10^{-4}$ $\Omega$cm) | Carrier Concentration ($\times 10^{20}$ cm$^{-3}$) | Mobility (cm$^2$/V$^{-1}$S$^{-1}$) | Film Thickness (nm) | References |
|---|---|---|---|---|---|---|
| MgIn$_2$O$_4$ | 85 | 20 | 1.8 | 15 | | Minami, T. et al., Thin Solid Films, 270, 1995 |
| MgIn$_2$O$_4$—Zn$_2$In$_2$O$_5$ | 82 | 10 | 3 | 2 | 400 | Minami, T. et al., 1 CMC TF, 1995 |
| In$_2$O$_3$: Ga | 85 | 5.8 | 5 | 20 | 400 | Minami, T. et al., JVST A 15(3), 1997 |
| GaInO$_3$ (Sn,Ge) | 90 | 29 | 4 | 10 | 1000 | Phillips, J. et al., Appl. Phys. Lett. 65(1), 1994 |
| (GaIn)$_2$O$_3$ | 90 | 10 | 3 | 20 | 100 | Minami, T. et al., JVST A 15(3), 1997 |
| ZnO(Al) | 90 | 1.4 | 9.9 | 45 | 150 | Imaeda, K. et al., 43$^{rd}$ AVS Symp., 1996 |
| ZnO(Ga) | 90 | 2.7 | 13 | 18 | 230 | Imaeda, K. et al., 43$^{rd}$ AVS Symp., 1996 |
| ZnSnO$_3$ | 80 | 45 | 1 | 20 | 310 | Minami, T. et al., JVST A 13(3), 1995 |
| Zn$_2$SnO$_4$ | 92 | 570 | 0.058 | 19.0 | 620 | Wu, X. et al., JVST A 15(3), 1997 |
| Zn$_2$In$_2$O$_5$ | 95 | 2.9 | 6.0 | 30 | 400 | Minami, T. et al., Thin Solid Films, 290-291, 1996 |
| Zn$_3$In$_2$O$_6$ | 80 | 3.8 | 3.4 | 46 | 1400 | Phillips, J. et al., Appl. Phys. Lett. 67(15), 1995 |
| ITO | 91 | 1-2 | 10 | 37 | 140 | Helz, B., OIC Topical Meeting, 1998 |

The amorphous structure and oxygen deficiency of the TCO theoretically allows the TCO coating to exhibit conductive properties and barrier properties similar to transparent dielectric barrier layers, such as non-stoichiometric types of silica or alumina. Also, because of the oxygen deficiency, and amorphous structure, the barrier layers gather the oxygen and keep the oxygen from passing through. Multiple thin layers of TCO function as both a transparent electrode and a transparent barrier layer. The benefit of using TCO alternating with metallic film layers, besides the beneficial barrier properties, is that all the layers of the structure are conductive, thus improving conductivity.

Figure 13:
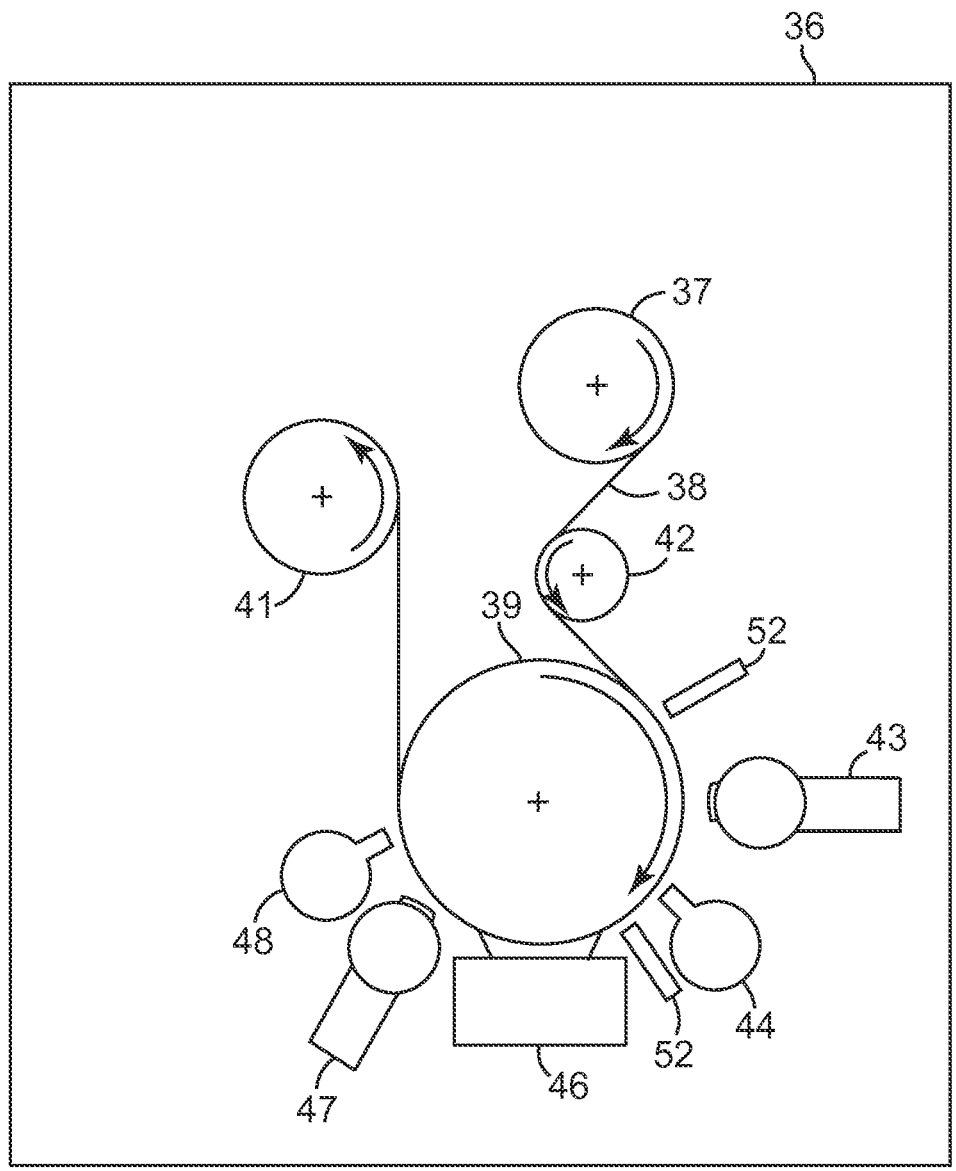
FIG. 13 is a schematic illustration of a coating apparatus for forming the conductive barrier layer of FIG. 1.

In the preferred embodiment, a suitable apparatus for coating the substrate with conductive and barrier layers is illustrated schematically in FIG. 13. All of the coating equipment is positioned in a vacuum chamber 36. A roll of polypropylene, polyester or other suitable plastic sheet is mounted on a pay-out reel 37. Plastic sheet 38 forming the substrate is wrapped around a first rotatable drum 39, and fed to a take-up reel 41. A roller 42 is employed, as appropriate, for guiding the sheet material from the pay-out reel to the drum and/or to the take-up reel.

A flash evaporator 43 is mounted in proximity to the drum at a first coating station. The flash evaporator deposits a layer or film of monomer, typically an acrylate, on the substrate sheet as it travels around the drum. After being coated with a monomer, the substrate sheet passes a radiation station where the monomer is irradiated by a source 44 such as an electron gun or source of ultraviolet (UV) radiation. The UV radiation or electron bombardment of the film induces polymerization of the monomer.

The sheet then passes coating station 46 where a coating of TCO is preferably applied by magnetron sputtering. The sheet then passes another flash evaporator 47 where another layer of monomer is deposited over the TCO layer. The sheet then passes radiation station 48 and the monomer is polymerized. Depending on whether a layer of monomer is above or below the TCO layer, either evaporator 43 or 47 is used. Clearly, if the TCO layer is to be sandwiched between layers of polymer, both evaporators and their respective radiation sources are used. In addition to magnetron sputtering, the TCO layer is processed by one of thermal evaporation, chemical vapor deposition, plasma enhanced chemical vapor deposition, and electron beam evaporation. Chemical vapor deposition is a high temperature process, and is therefore the least desirable for use with plastic substrates but is acceptable for metal foil substrates.

In an alternative embodiment, a LML smoothing or hardcoat layer applicator 52 is mounted in proximity to the drum at a first coating station. The liquid smoothing applicator deposits a layer of monomer, e.g. acrylate, over the substrate. This layer of monomer is cured by irradiation from an ultraviolet or electron beam source 44 adjacent the drum (the positions of source 44 and applicator 52 are interchanged). Additionally, the sheet then passes coating station 46 where a coating of thin metal film, metal oxide, and/or metal nitride is applied by one of vacuum sputtering, vacuum metallizing, plasma assisted chemical vapor deposition, or electron beam evaporation. For example, silicon oxides is deposited by a plasma enhanced chemical vapor deposition process using a metal organic precursor and an oxidizing or inert carrier gas coating station 46 alternatively containing deposition sources.

The various layers described are deposited in several processes, in addition to vacuum coating techniques. For instance, the layers are deposited through nonvacuum (atmospheric) roll coating. Alternatively or additionally, the layers are deposited by an in line coating machine, whereby a conveyor belt runs the substrate to be coated past multiple coating stations. In a further alternative, the layers are deposited by an intermittent motion machine, that is either in a vacuum process or a nonvacuum process. In yet another alternative, the layers are coated using a multitude of machines and/or processes. For instance, the plastic substrate is first coated through atmospheric roll coating with a cured polymer and subsequently coated by vacuum deposition, or liquid coated, such as Gravure coating.

For multiple layers of organic polymer coatings deposited in the PML process, take up reel 41, with the sheet wound thereon, functions as the payout reel 37, and the process is repeated as desired by coating in both directions. For this alternative, additional curing stations are mounted on the opposite side of evaporators 43 or 47. The roll of sheet is removed from the vacuum system for use.

Figure 14A:
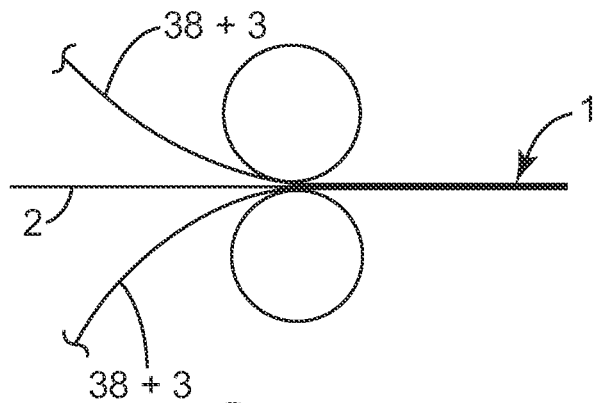
FIG. 14$a$ is a schematic illustration of a laminating process for the FPD of FIG. 1.
Figure 14B:
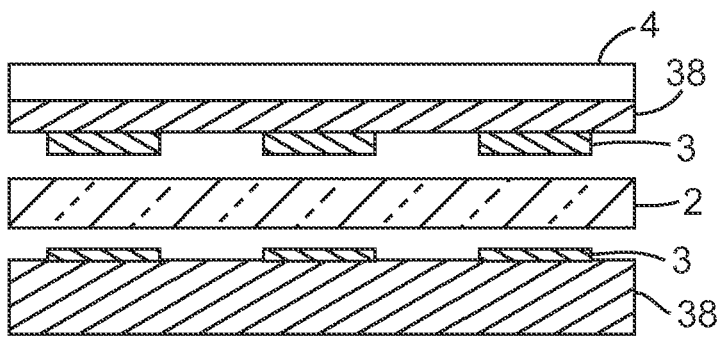
Figure 14C:
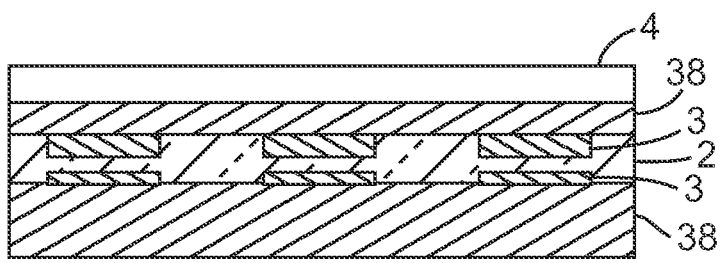

FIG. 14a illustrates a laminating process for the FPD where plastic substrates, hardcoating, and a display medium are bonded together, for example, with an adhesive and pressure, temperature or UV radiation. FIGS. 14b and 14c are cross-sectional schematic views of the FPD before and after undergoing the bonding process, respectively. The laminating process is one of the alternate methods for bonding the layers to construct the FPD. Because the layers of the present invention are thin, cracking, crazing, and delamination are avoided using processing methods of this type. FIGS. 14b and 14c illustrate schematically the flat panel display with an exterior protective overcoat 4 and the display medium 2. The display medium also may be liquid, or deposited over either substrate, or over a carrier film.

Transparent dielectric layers with good barrier properties and a high refractive index, such as metal oxides like titanium oxide or aluminum oxide, or metal nitrides such as silicon nitride or aluminum nitride, used in combination with thin, transparent metallic film layers provide a transparent conductive barrier coating. The metal oxide or metal nitride layers are deposited at specific thicknesses to optimize the optical performance (e.g. transmittance) of a particular display. Preferably, the thin metallic film layer is sandwiched in between layers of metal oxide or metal nitride. Multiple alternating layers of metal oxides or metal nitrides, with their barrier properties, and the highly conductive metallic film layers provide increased barrier performance and conductivity for a particular display medium.

The optical and electrical performance of transparent conductive oxide coatings are also improved by mildly heating the coated substrate during deposition or by post-annealing the coated substrate. As shown in the Experimental Results below, even though the PET substrate was heated to a moderate temperature of only 65° C., the resistivity of the ITO was still low enough to effectively operate as an electrode, because of the multiple thin layers of ITO.

Figure 11:
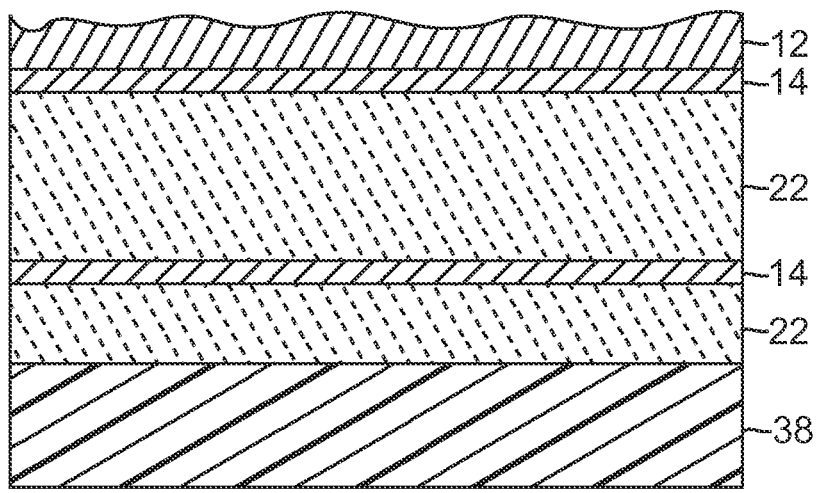
FIG. 11 is a cross-sectional view of an embodiment of conductive barrier layers of FIG. 1.

In an alternative embodiment, the thin conductive metal nitride layer is substituted for one or more thin metallic film layers, for example, for the metal layers in the "optically enhanced metal" (see FIG. 11). Metal oxide or TCO layers are utilized with the metal nitride layer for enhancing both the optical and electrical performance characteristics. Metal nitrides have good gas barrier properties. However, to achieve very low moisture (water vapor) and oxygen permeability, there is a minimum thickness of barrier material, e.g. the metal nitride layer. Because of the higher optical transparency silicon nitride thin films, for example, are attractive candidates for flexible FPD as barrier layers for atmospheric gases.

In another alternative embodiment, at least one of the metallic film layers in, for example, the "optically enhanced metal" is replaced with a polymer layer formed via the PML processes.

Results of Conducted Experiments

The plastic substrate for a flat panel display has a very low oxygen and water vapor permeability, a surface roughness much less than the barrier film thickness, a high Tg (the glass transition temperature) to allow a higher temperature and/or higher energy ITO deposition process, and a high transparency with low birefringence.

Defects in the coated layers limit the barrier properties. For instance, rough substrates, particulates, and roller contact, damage the coated layers. Rough substrates with thin film barriers are smoothed and prevented from damage by roller contact, with an organic basecoat and polymer top coat.

Multiple layers of TCO deposited on the substrate achieve lower surface resistivity than a single thick layer of TCO because the single layer cracks and/or crazes from stress. Further, the multiple TCO layers act as electrodes connected in parallel. Using a non-stoichiometric dielectric of a group including silicon oxides, aluminum oxides, and silicon nitrides, allows for the fabrication of efficient thin film barriers for flexible plastic films.

Measured data for films made of sputtered ITO exhibited exceptional barrier properties. The optical, electrical and barrier properties were measured for ITO sputter-deposited directly onto a PET substrate, and also measured with a PML acrylic basecoat over the substrate before deposition of the ITO, in a roll-to-roll (web) coating process. See FIGS. 15-18, and the descriptions of these Figures below. The typical performance of a single ITO layer deposited on a basecoated PET substrate is 85% T (Transmittance) and 80 ohms/square. The ITO layer has a physical thickness of about 140 nm, for a one-half wave optical thickness, while the PET substrate has a thickness of about 0.007". For the single layer ITO film, oxygen permeability ranged from 0.005 to 0.05 oxygen $cc/m^2/day$, while the water vapor permeability ranged from 0.005 to 0.05 $g/m^2/day$.

Figure 15:
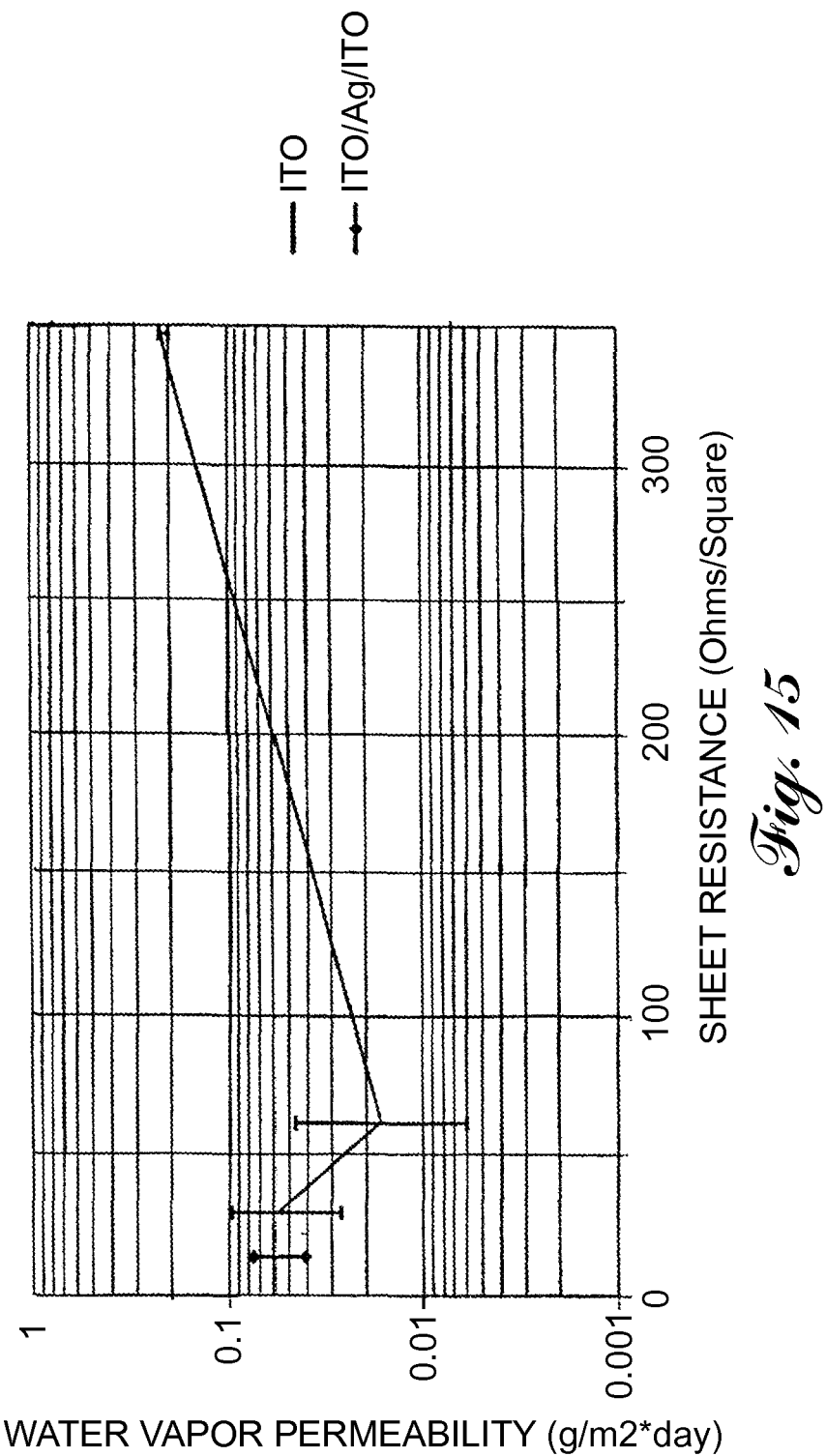
FIG. 15 is a chart showing water vapor permeability of an ITO film deposited on a polyethylene terephthalate (PET) substrate versus ITO film sheet resistance.

FIG. 15 discloses a chart showing water vapor permeability of (1) ITO film deposited over the PET substrate, and (2) a PET substrate coated with "optically enhanced metal": an ITO film layer, a silver layer, and another ITO film layer, versus ITO film resistance. No smoothing base coat was applied to the substrate in either case. The ITO layer was DC sputter deposited onto the PET substrate. The deposited ITO film alone is reactively sputtered from a metal target in a web coater. The solid lines shown connect the midpoints of the range of permeability results at each measured resistance for the ITO film sheet. The chart shows that for the ITO film layer, the water vapor permeability dips to a minimal value of approximately 0.006 $g/m^2$ day at a resistance of about 60 ohms/square. The water vapor permeability reaches a maximum of approximately 0.21 $g/m^2$ day at a resistance of about 350 ohms/square. For the silver layer in between the ITO film layers, the approximate water vapor permeability range was 0.04 to 0.075 $g/m^2$ day for the sheet resistance at about 12 ohms/square.

Figure 16:
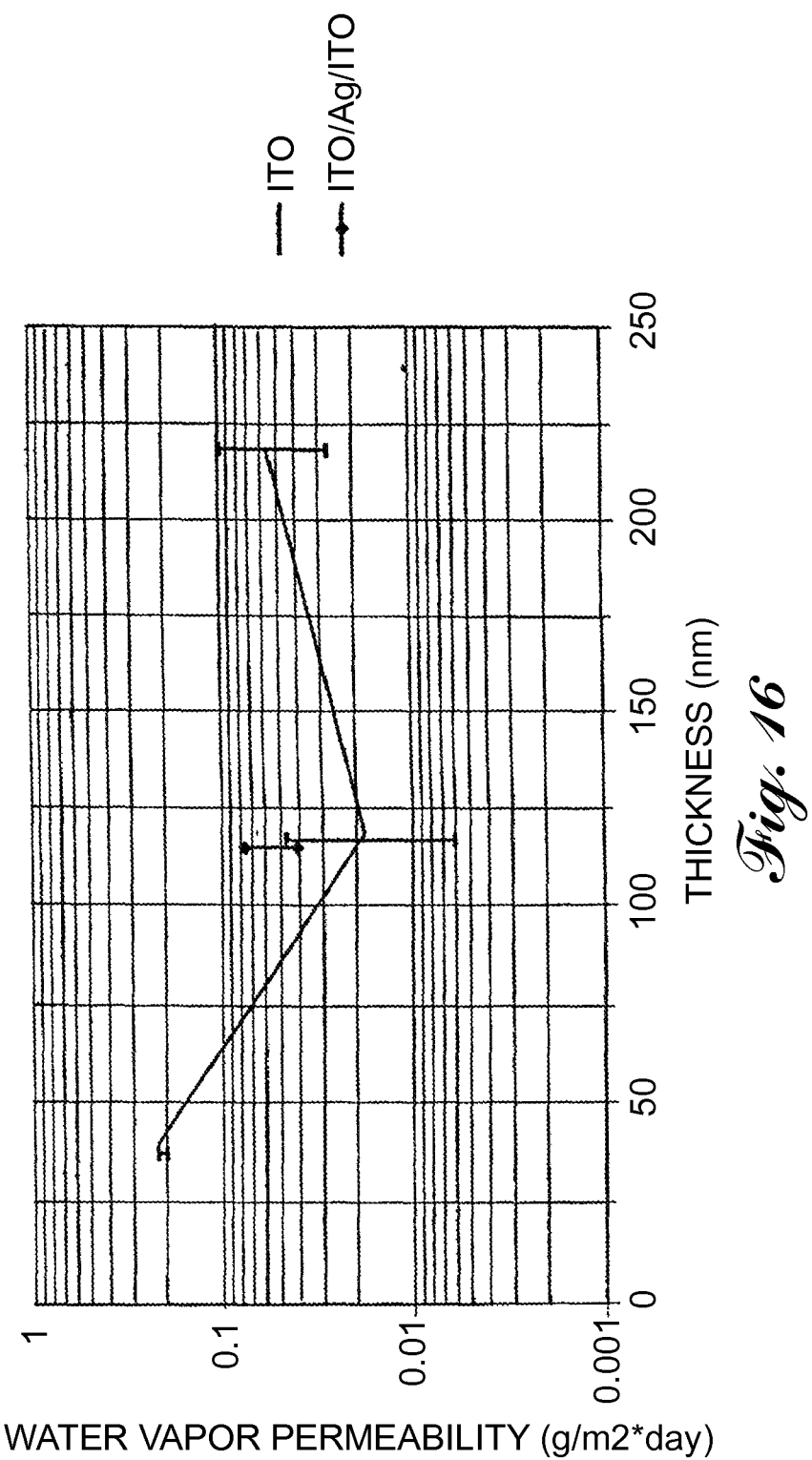
FIG. 16 is a chart showing water vapor permeability of ITO film deposited on a PET substrate versus ITO film thickness.

FIG. 16 discloses a chart showing water vapor permeability of an (1) ITO film deposited over the PET substrate, and (2) a PET substrate coated with "optically enhanced metal", an ITO film layer, a silver layer, and another ITO film layer, versus ITO film sheet thickness. The parameters for the ITO layer alone are analyzed in the same manner as above. The chart shows that for the ITO film layer, the water vapor permeability dips to a minimal value of approximately 0.006 $g/m^2$ day at an ITO thickness of about 120 nm. The water vapor permeability reaches a maximum of approximately 0.21 $g/m^2$ day at an ITO thickness of about 40 nm. For the substrate with the sandwiched silver layer, the approximate water vapor permeability range was 0.04 to 0.075 $g/m^2$ day for a total ITO coating thickness of approximately 120 nm.

Figure 17:
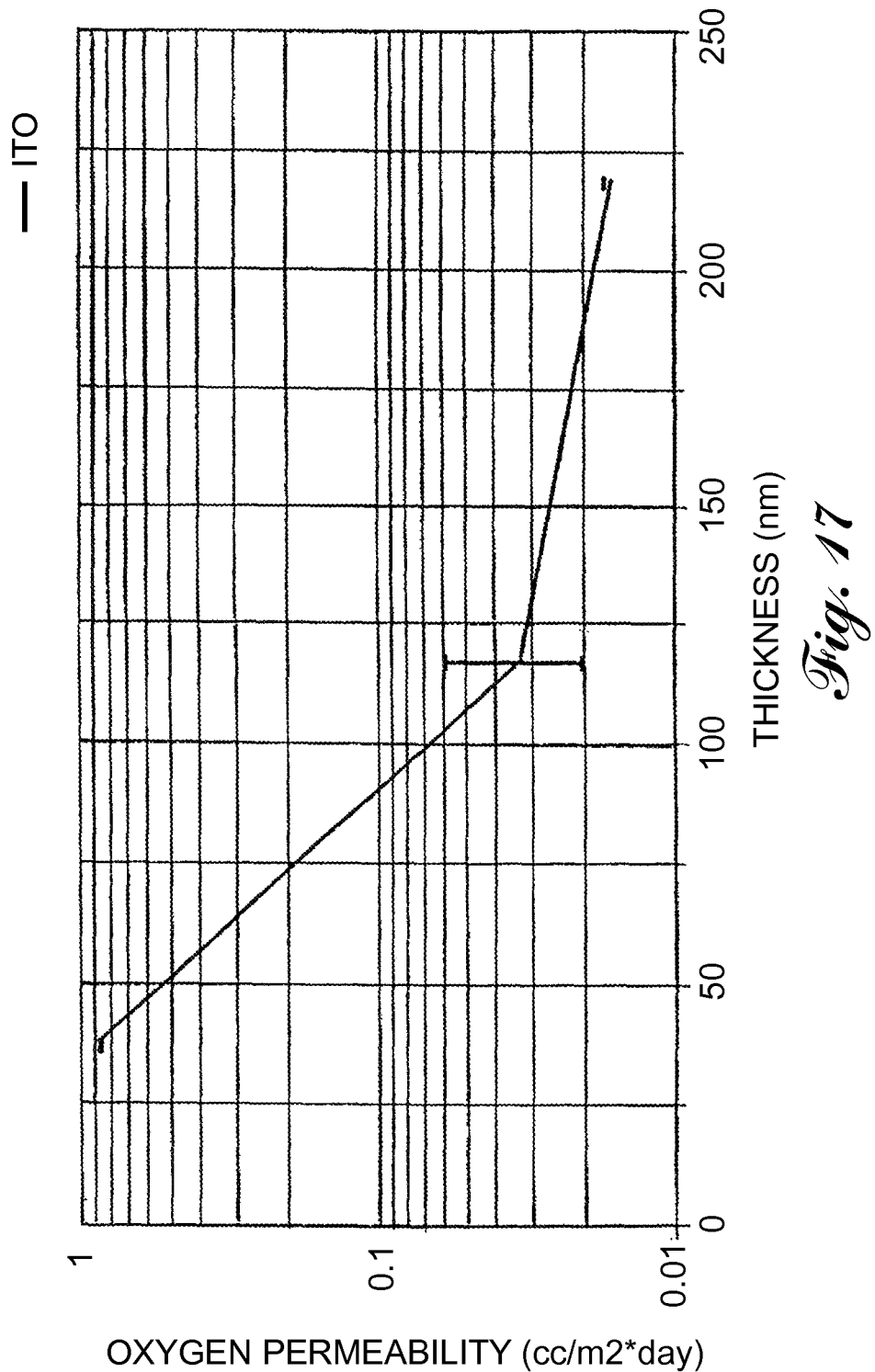
FIG. 17 is a chart showing oxygen permeability of ITO film deposited on a PET substrate versus ITO film thickness.
Figure 18:
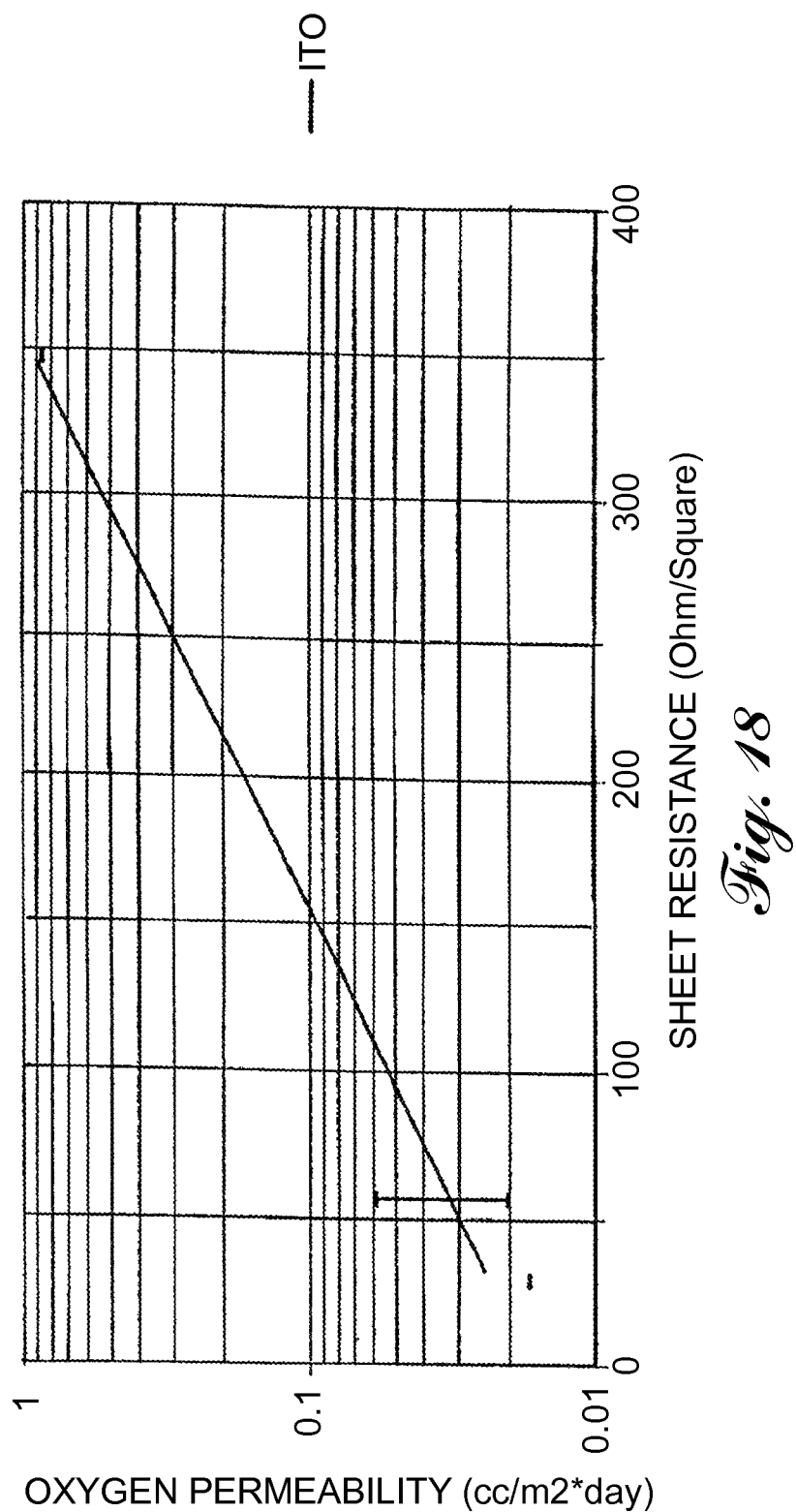
FIG. 18 is a chart showing oxygen permeability of ITO film deposited on a PET substrate versus ITO film sheet resistance.

FIGS. 17 and 18 disclose charts showing oxygen permeability of ITO film deposited on a PET substrate versus ITO film thickness and versus sheet resistivity, respectively. FIG. 17 shows that the permeability dips to a minimal value of approximately 0.017 $g/m^2$ day at an ITO thickness of about 220 nm. The permeability reaches a maximum of approximately 0.9 $cc/m^2$ day at an ITO thickness of about 40 nm.

As shown in Table 1, alternating barrier layers of PML deposited organic polymers and dielectrics have permeation rates below the limits of the instruments, which is 0.005 $g/m^2$ day for Permatran-W 3/31, which is an instrument that measures water vapor transmission rates, and 0.005 $cc/m^2$ day for Ox-Tran 2/20, which is an instrument that measures oxygen transmission rates.

The transparent dielectric barrier layer or the single layer of TCO deposited on the substrate has suitable barrier properties for the plastic FPO. The preferable barrier properties vary by the type of display technology: liquid crystal display (LCD), organic light emitting display (OLED), or thin film electro luminescent displays (TFELD). The acceptable value of vapor permeation with plastic substrates for FPD depends on the sensitivity of the specific display technology utilized. For example, the LCD is much less sensitive to vapor permeation than the OLED or TFELD. For the LCD, maximum oxygen permeability is in the range of about 0.01 to 0.1 cc/m² day, while the maximum water vapor permeability is in the range of about 0.01 to 0.1 g/m² day. For both OLED and TFELD, permeabilities of ≦0.001 cc/m² day for oxygen. and ≦0.001 g/m² day for moisture (water vapor) are preferred.

A polymer OLED and a small molecule OLED describe the two basic technologies for the layer that emits light in the OLED. For polymer OLED's, the light emitting material is deposited by flow coating, spin coating, gravure coating, meniscus coating, curtain coating or any common liquid coating or printing techniques. The small molecule OLED is normally thermally evaporated in a vacuum, but may also be processed with nonvacuum coating methods. When the ITO layer is deposited by nonvacuum processes such as by screen printing, the process of the present invention is entirely nonvacuum. Alternatively, the process of the present invention takes place by both vacuum and nonvacuum methods. Preferably, the process takes place entirely in a vacuum to avoid contamination by particulates, moisture and oxygen. Superior barrier films and other films result from the cleaner vacuum process.

As shown in FIGS. 15 and 16, and described above, for the LCD as long as the ITO sheet resistance is below about 250 ohms/square, and the ITO film thickness is between about 75 and 225 nm, the water vapor permeability is within desirable limits for the LCD. As shown in FIG. 17, the oxygen permeability is within desirable limits for the LCD as long as the ITO film thickness is above about 85 nm and the sheet resistance is below about 150 ohms/square. Because of the lower permeabilities preferred for the emissive displays (e.g. OLED and thin film electro luminescent displays), the barrier capability is enhanced by multilayer dielectric or TCO barriers in combination with PML processed polymer coatings (i.e. composite barrier layers of PML deposited organic polymer layers, dielectric layers and/or TCO layers).

Figure 24:
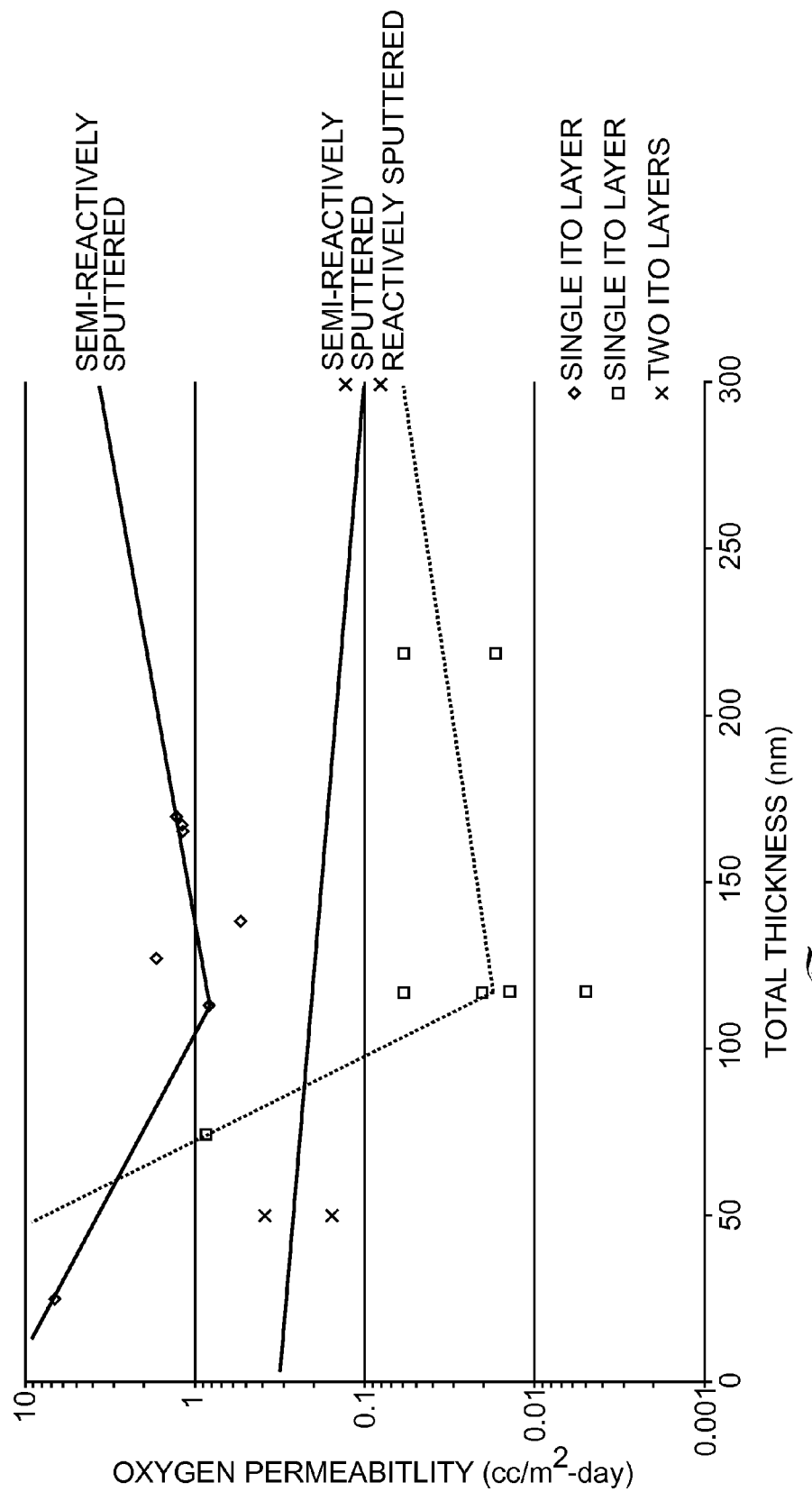
FIG. 24 is a chart showing oxygen permeability of an ITO film deposited on a flexible plastic substrate versus thickness.
Figure 25:
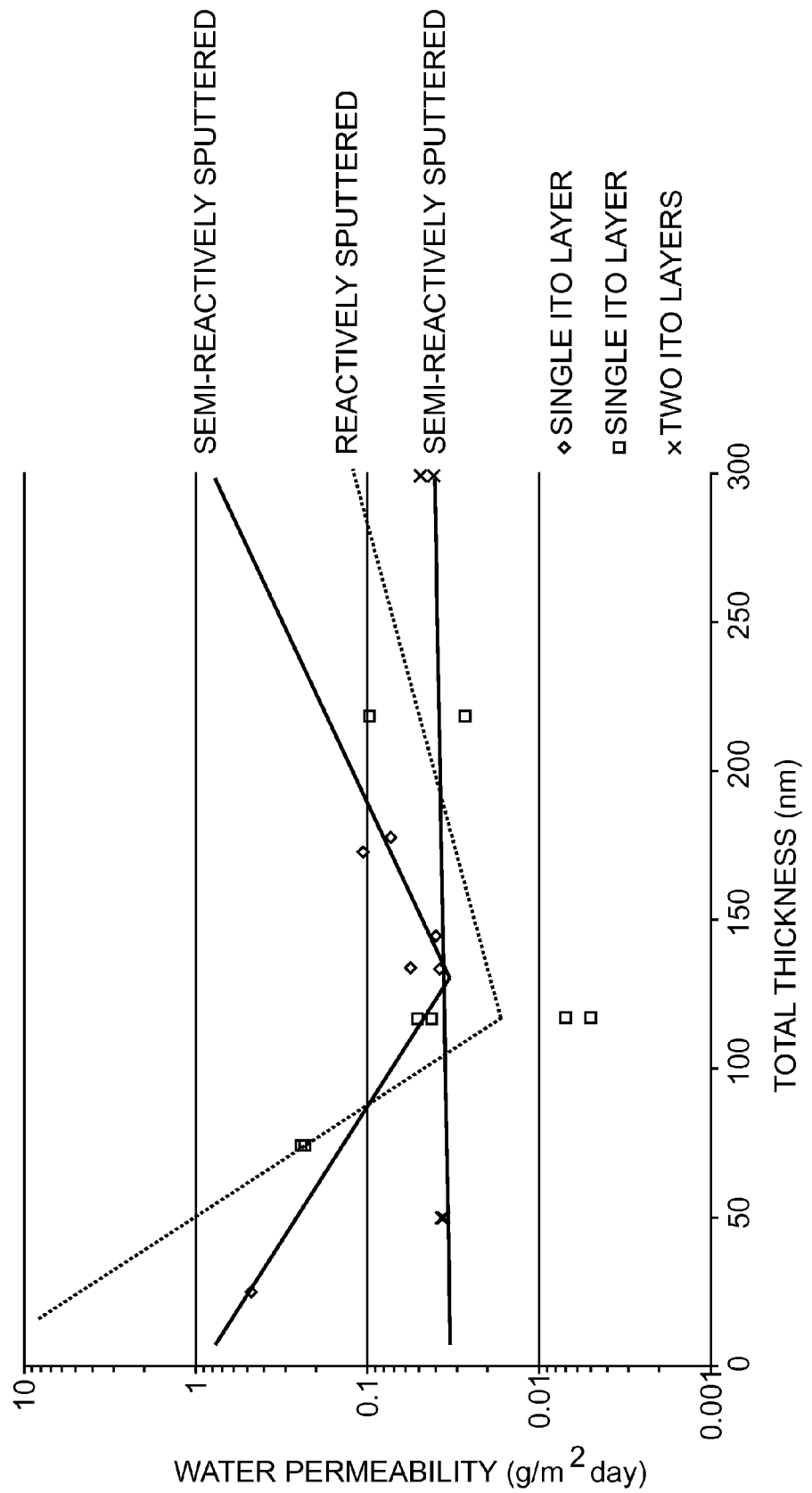
FIG. 25 is a chart showing water vapor permeability of an ITO film deposited on a flexible plastic substrate versus thickness.
Figure 26:
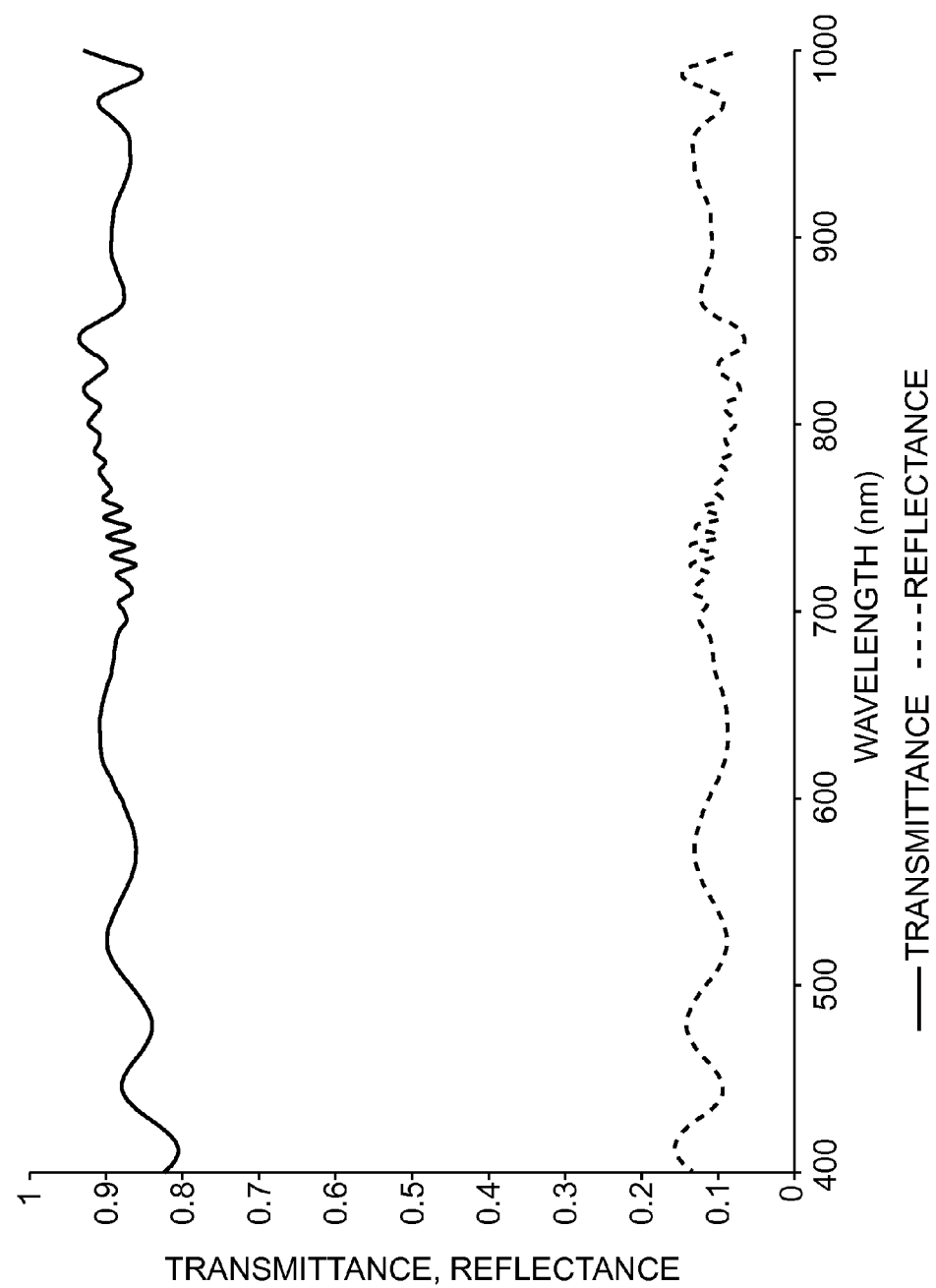
FIG. 26 is a chart showing transmittance and reflectance spectra (for semi-reactively sputtered ITO on a PET substrate; polymer/ITO=25 nm) versus wavelength.
Figure 27:
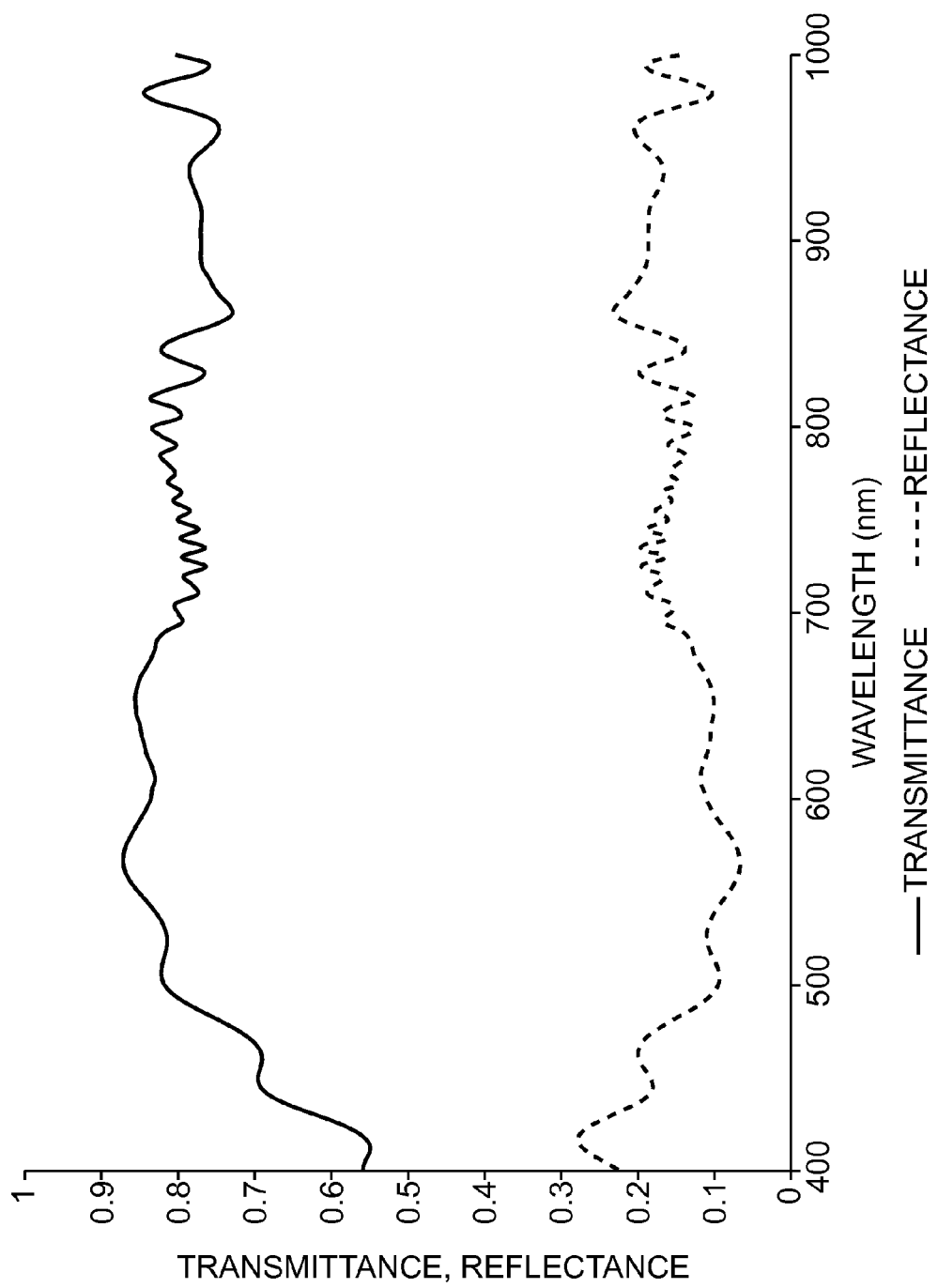
FIG. 27 is a chart showing transmittance and reflectance spectra (for semi-reactively sputtered ITO on a PET substrate; polymer/ITO=153 nm) versus wavelength.
Figure 28:
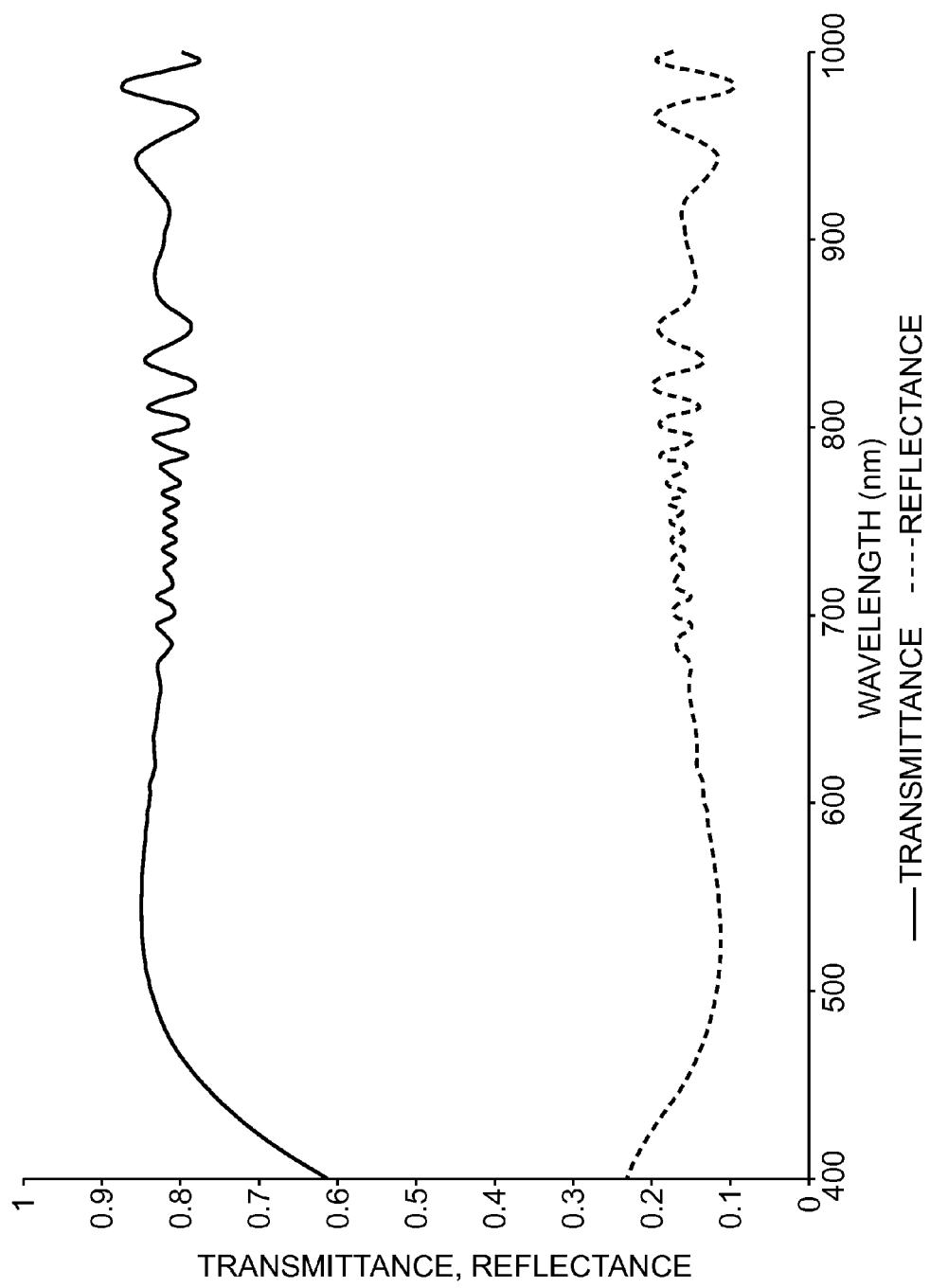
FIG. 28 is a chart showing transmittance and reflectance spectra (for semi-reactively sputtered ITO on a PET substrate; polymer/ITO=134 nm) versus wavelength.
Figure 29:
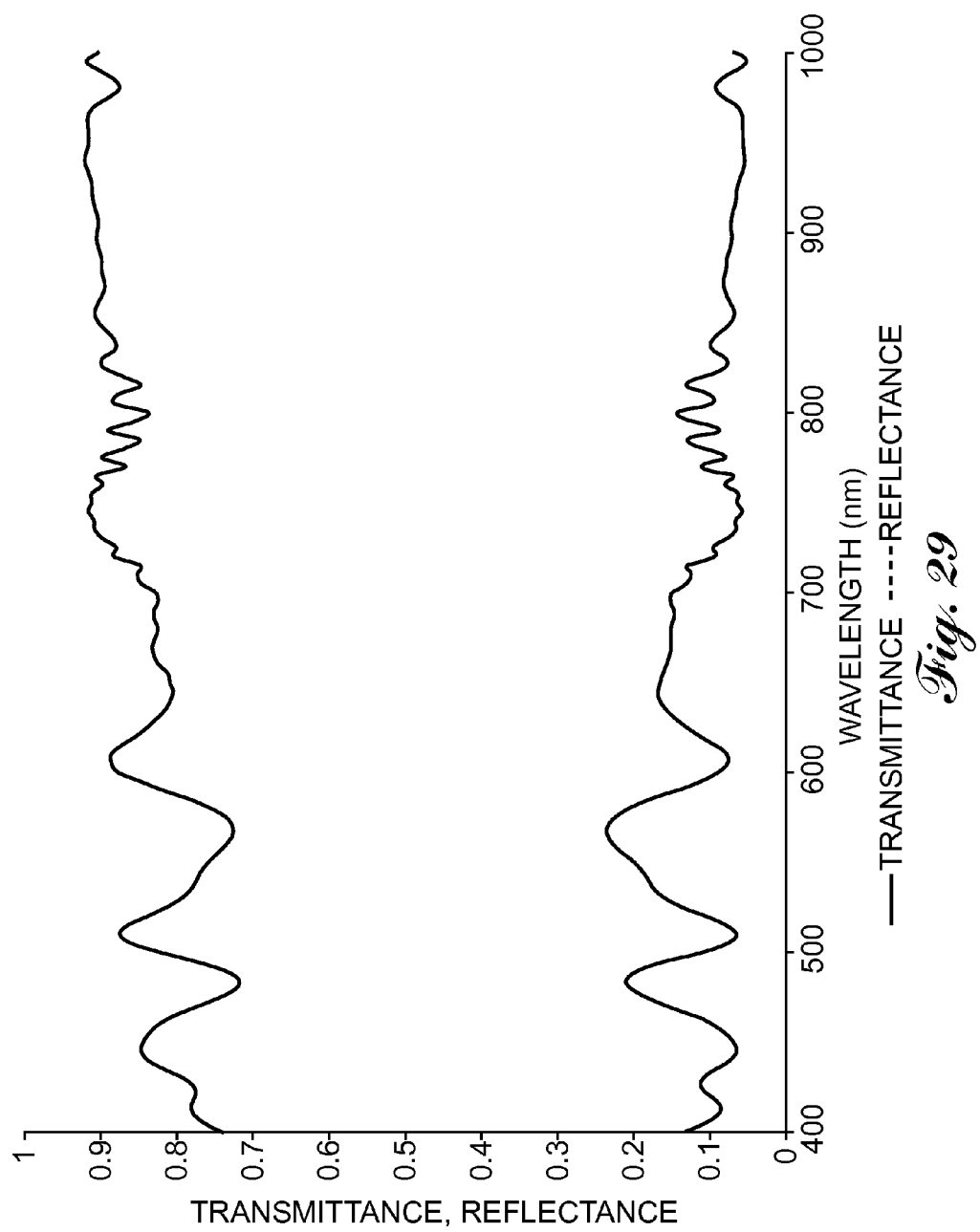
FIG. 29 is a chart showing transmittance and reflectance spectra (for semi-reactively sputtered ITO/polymer on a PET substrate; two ITO layers=50 nm total) versus wavelength.
Figure 30:
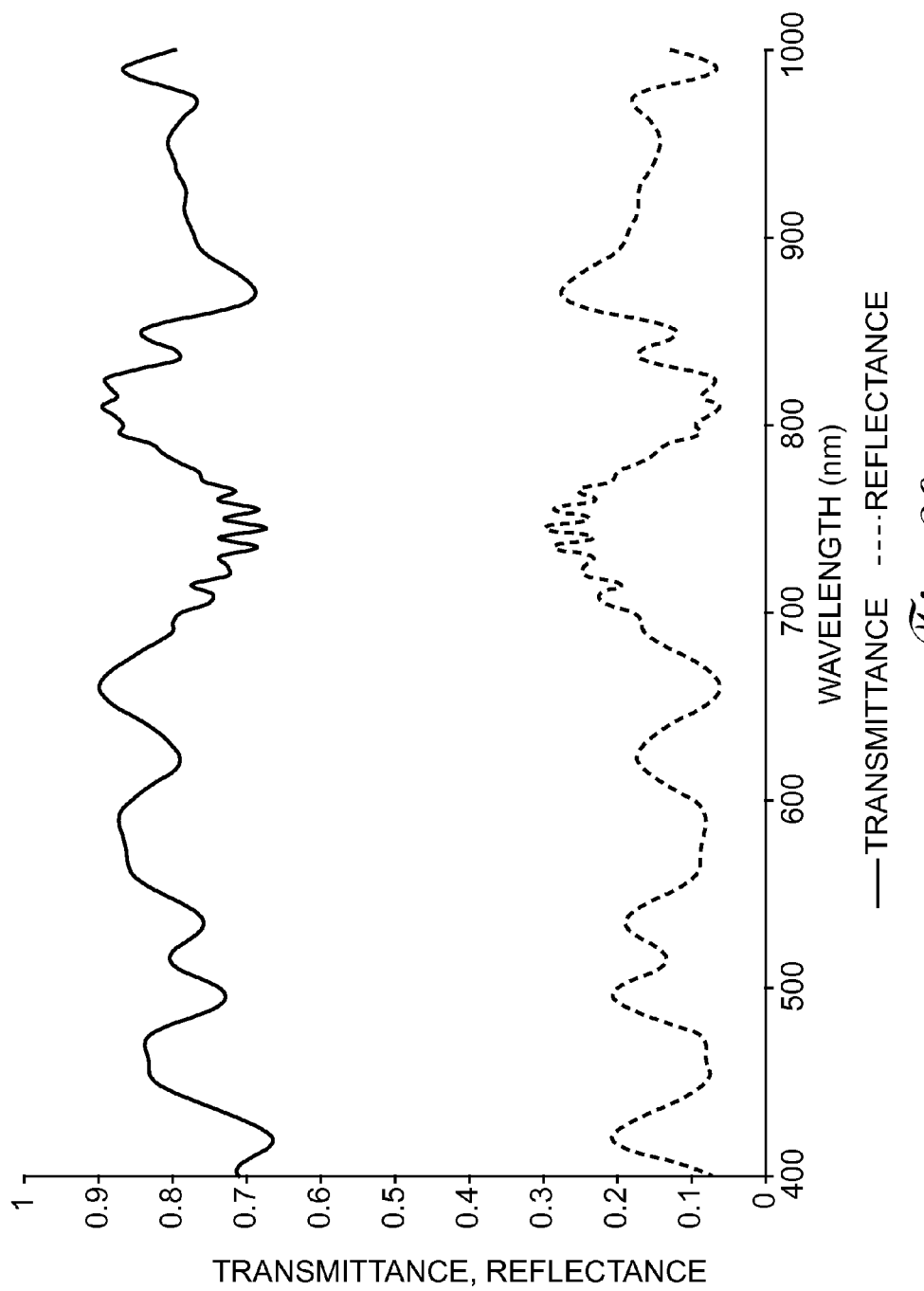
FIG. 30 is a chart showing transmittance and reflectance spectra (for semi-reactively sputtered ITO/polymer on a PET substrate; two ITO layers=299 nm total) versus wavelength.

Table B illustrates water vapor and oxygen permeability versus ITO thickness for semi-reactively sputtered ITO. The measured results for semi-reactively and reactively sputtered ITO, as well as the differences between a single ITO layer and two ITO layers (with a polymer layer in between the two layers) made with a semi-reactive process, are illustrated in FIGS. 24 and 25. 'Semi-reactively' sputtered refers to films, DC magnetron sputtered from a ceramic target. The differences between the two processes are believed to be due to the specific process parameters, and not inherent to the process type. As shown, for the same total thickness deposited by the same reactive process, two ITO layers have higher conductivity and lower permeability as compared to the single ITO layer. Further, the two ITO layers have higher electrical performance, because the single ITO layer cracks and/or crazes.

TABLE B

TRANSPARENT BARRIER COATINGS BASED ON ITO FOR FLEXIBLE PLASTIC DISPLAYS
Experimental Results for ITO Barriers on PET
Semi-Reactively Sputtered

| Total ITO Thickness (nm) | Surface Resistivity (ohms/ square) | Rho ($\times 10^{-4}$ n-cm) | Luminoust (%) | $H_2O$ Permeance (cc/m²-day) | $O_2$ Permeance (g/m²-day) |
|---|---|---|---|---|---|
| 123.3 | 38.3 | 4.685 | 84 | 0.038 | 0.827 |
| 172.4 | 29.9 | 5.145 | 82 | 0.073 | 1.19 |
| 299.2 | 17.2 | 5.15 | ~81 | 0.049 | 0.081 |
| 49.9 | 188.4 | 9.4 | ~81 | 0.036 | 0.156 |
| 218.5 | 31.8 | 6.94 | ~80 | 0.0621 | 0.038 |
| 117.05 | 57.48 | 6.64 | ~82 | 0.12 | 0.0246 |
| 74.3 | 348.5 | 25.6 | ~86 | 0.2375 | 0.8625 |

TABLE B-continued

TRANSPARENT BARRIER COATINGS BASED ON ITO FOR FLEXIBLE PLASTIC DISPLAYS
Experimental Results for ITO Barriers on PET
Semi-Reactively Sputtered The preferred thickness for the deposited layers is different for conductivity properties than for barrier properties. The thickness of the deposited film is related to the film's conductive and barrier properties. The critical thickness for barrier properties of these layers varies with the material and, to a lesser extent, how the layer is deposited. For ITO, the critical thickness is about 20 nanometers (or 200 angstroms), minimum. The lower thickness limits for some of the metal oxides which are typically used in packing applications is in about the 10 to 30 nanometer range. Generally, 5-10 nanometers is the minimum thickness for adequate barrier properties. Enhanced conductive properties result from film thicknesses in the range of about 20 nanometers to 300 nanometers. If the single layer film is thicker than that range, then the film starts cracking, and hence, loses conductivity and barrier properties. For maximizing single layer optical transmission, it is well known that certain optical thicknesses, e.g. one-half wave, of thin films are selected. The typical physical thickness is in the range of about 20 to 300 nanometers for ITO on a flexible substrate.

FIGS. 20-23 are charts showing transmittance and reflectance spectra versus wavelength for an ITO layer deposited over a PET substrate at a sheet resistance of 29 ohms/square, 57 ohms/square, 65 ohms/square, and•347 ohms/square, respectively. As shown, generally, for a range of the sheet resistance, the percentage of spectral transmittance and reflectance remains relatively constant. For example, at about a wavelength of 500 nm, the transmittance percentage is about•80% for resistance ranging from 29 ohms/square to 347 ohms/square. DC sputter deposited ITO on a hardcoated PET substrate exhibited a sheet resistivity of 46.9 ohms/square, which is a volume resistivity of approximately $5 \times 10^{-4}$ ohm-cm, and a visible transmittance of about 84.7%. Generally, the transmittance increases (and the reflectance decreases) as the plasma wavelength increases. There is always a compromise between high optical transmittance and high conductivity.

Figure 19:
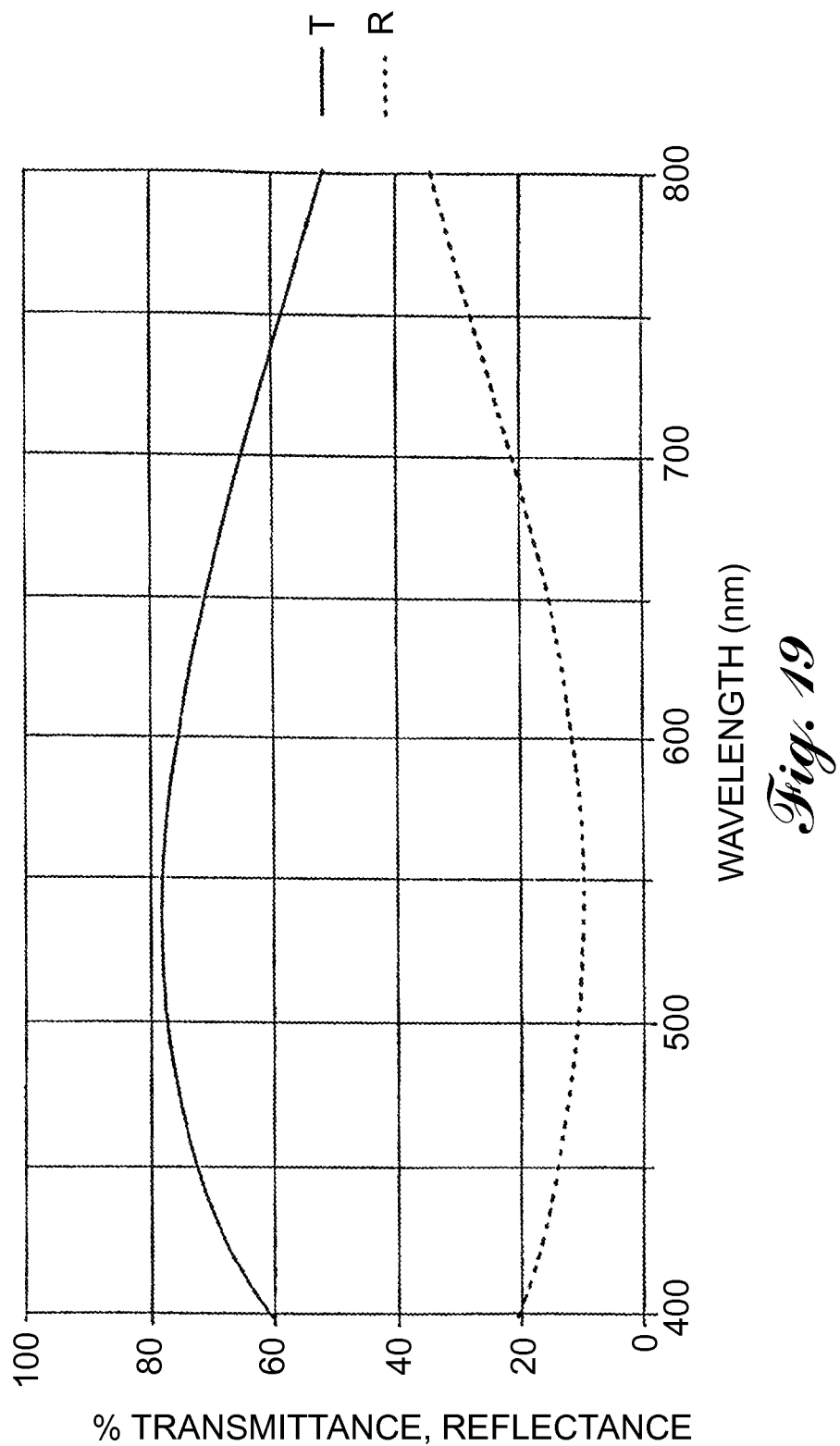
FIG. 19 is a chart showing transmittance and reflectance spectra (for an ITO layer over a silver film layer over an ITO layer over a PET substrate at a sheet resistance of 14 Ohms/Square) versus wavelength.
Figure 20:
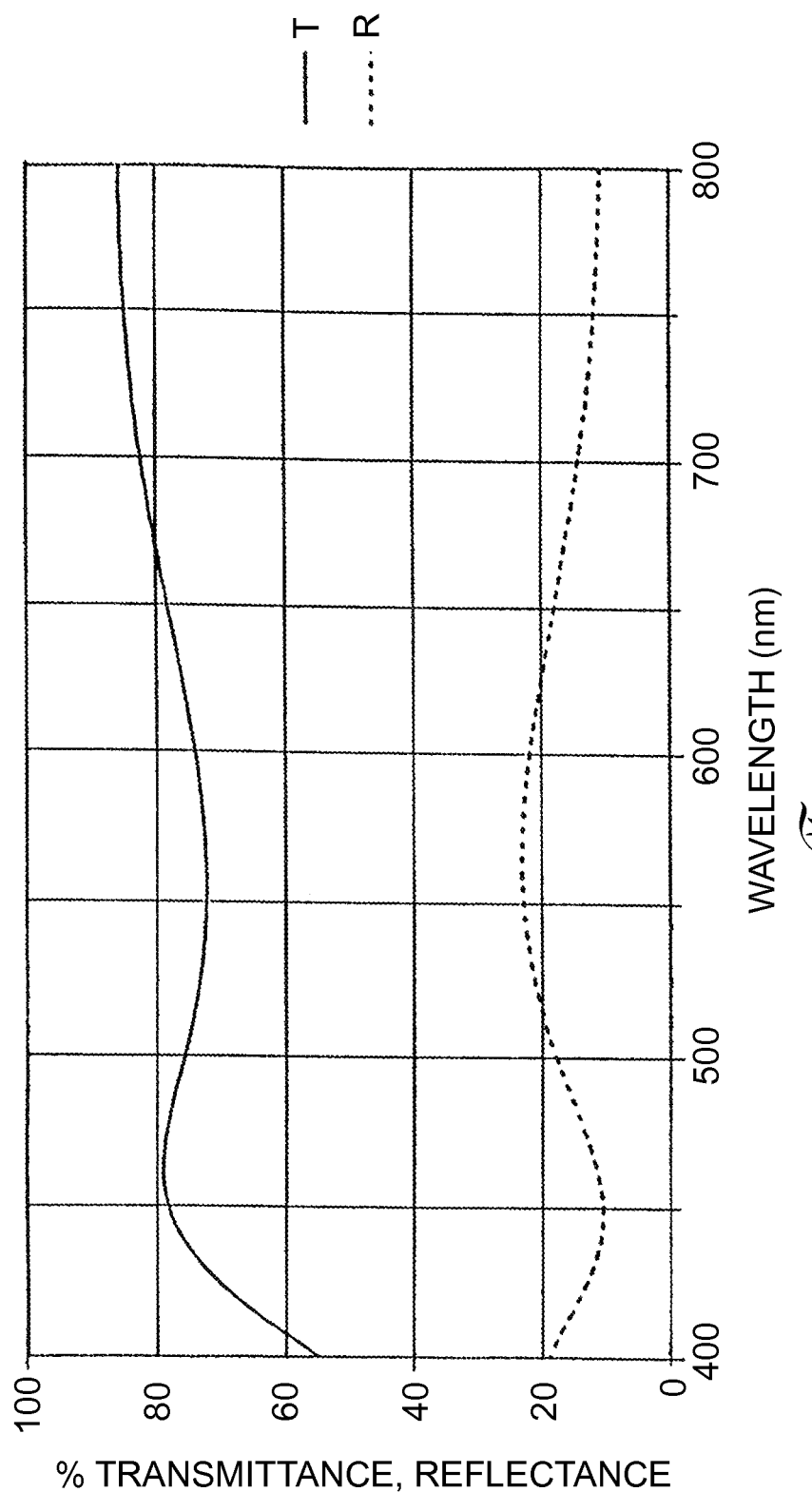
FIG. 20 is a chart showing transmittance and reflectance spectra (for an ITO layer over a PET substrate at a sheet resistance of 29 Ohms/Square) versus wavelength.
Figure 21:
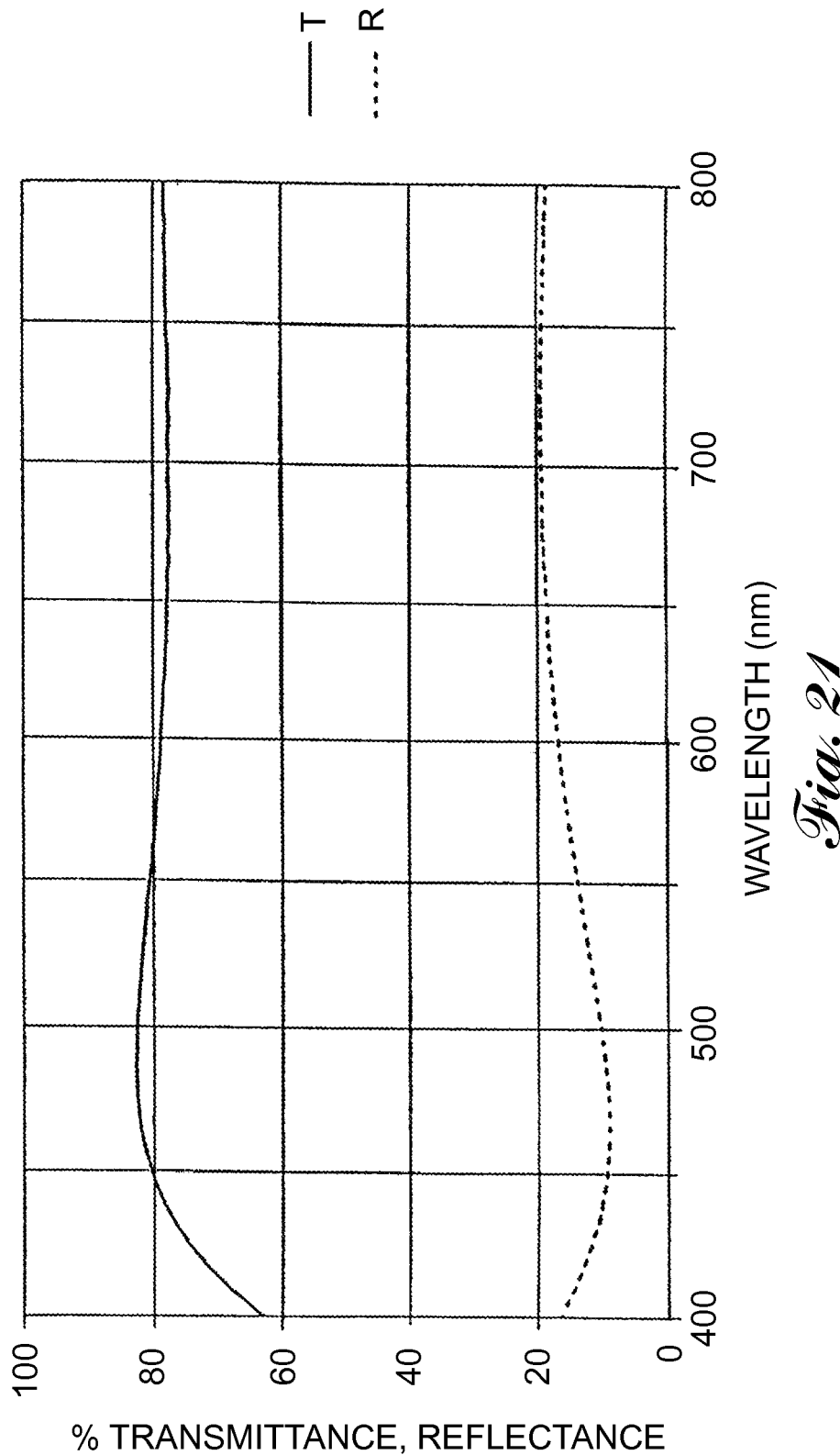
FIG. 21 is a chart showing transmittance and reflectance spectra (for an ITO layer over a PET substrate at a sheet resistance of 57 Ohms/Square) versus wavelength.
Figure 22:
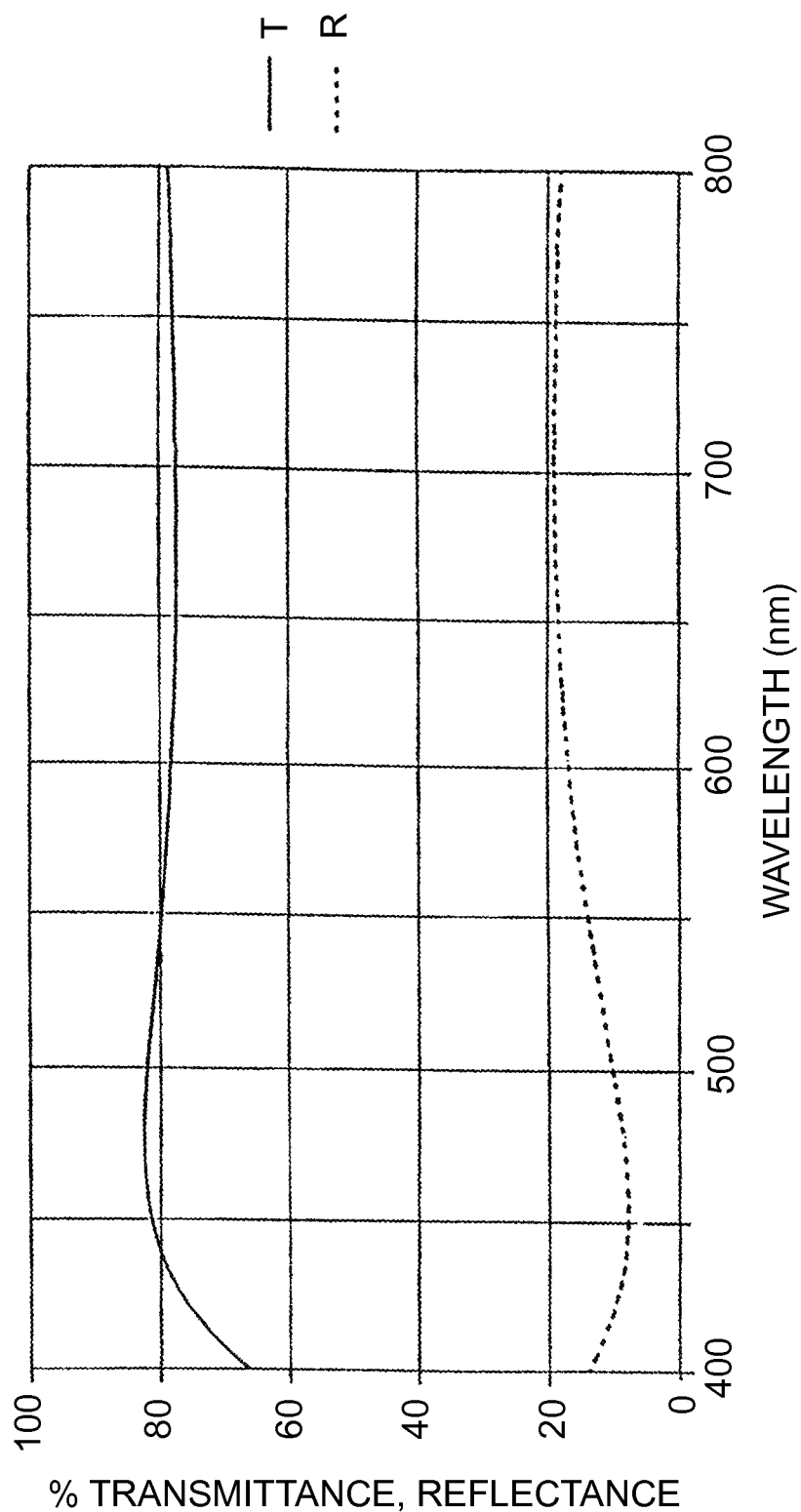
FIG. 22 is a chart showing transmittance and reflectance spectra (for an ITO layer over a PET substrate at a sheet resistance of 65 Ohms/Square) versus wavelength.
Figure 23:
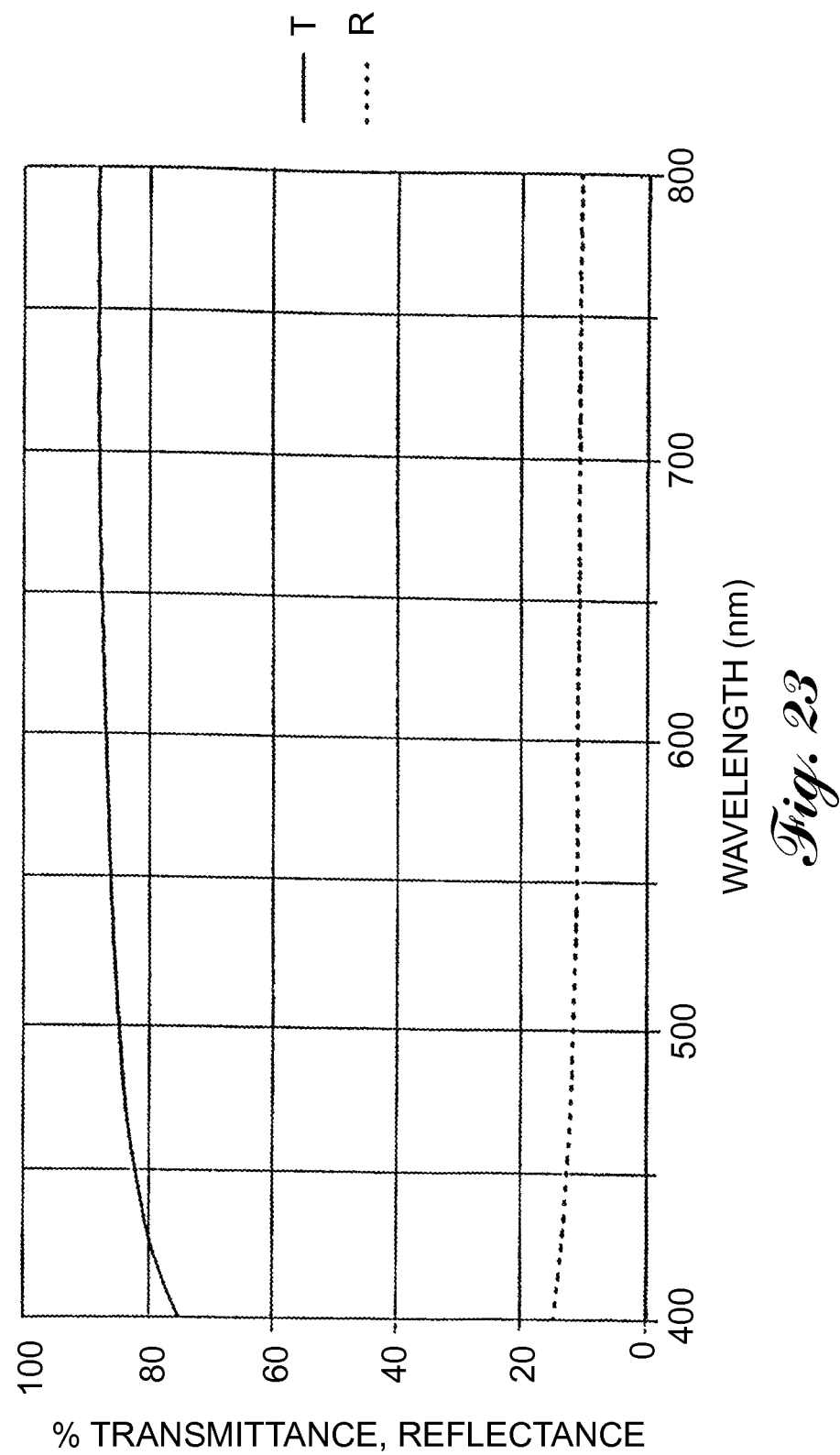
FIG. 23 is a chart showing transmittance and reflectance spectra (for an ITO layer over a PET substrate at a sheet resistance of 347 Ohms/Square) versus wavelength.

In contrast to FIGS. 20-23, in FIG. 19 the transmittance decreases and the reflectance increases at the higher wavelengths. FIG. 19 is a chart showing transmittance and reflectance spectra versus wavelength for a more preferred embodiment of the present invention. FIG. 19 shows the transmittance spectra for a PET substrate coated with layers of an ITO, silver film, and•another ITO at a sheet resistance of 14 ohms/square.

FIGS. 26-30 illustrate the Transmittance and Reflectance of semi-reactively sputtered ITO on a PET substrate for various thicknesses versus wavelength. The transmittance and reflectance of a substrate coated with a polymer layer and an ITO layer, a substrate with an ITO layer, and a substrate with two ITO layers (with a polymer layer in between the two ITO layers) are illustrated. Generally, transmittance and conductivity are inversely related. Improved optical performance is achieved by controlling the thickness and index of the polymer layers.

For a transparent electrode, conductivity specifications vary with display technology and addressing method. The surface, resistivity for LCD's is about 50-300 ohms/square, and for OLED's is about 10-100 ohms/square. The corresponding visible transmittance for LCD's is about 90%, and for OLED's is about 80-85%. The thickness of the conductor layer is compatible with the vacuum web coating processing for the flexible plastic substrate.

Table 1 shows the test results for oxygen and water vapor transmission rates of various samples of a PET substrate coated with a single ITO layer with different ohms/square coatings and a substrate coated with an ITO layer, a metal layer, and another ITO layer. The test conditions were as follows: the temperature was at 23° C./73.4° F. On each side of the barrier for the oxygen transmission rate tests, the relative humidity was 0%. On one side of the barrier for the water vapor transmission rate tests, the relative humidity was 100%, but the other side of the barrier had a relative humidity of 0%.

The first eight samples of Table 1 are of a plastic substrate coated with a single ITO film layer, each with different nominal ITO thickness and sheet resistances. For example, the '25-1' is the first sample with a sheet resistance of 25 ohm/square; whereas '25-2' is the second sample from the same lot. The last two samples are of a substrate coated with an ITO layer, a metal coating, and another ITO layer, with a nominal sheet resistance of 10 ohm/square. This 3 layer configuration is the "optically enhanced metal", or "induced transmission filter", and has similar characteristics to a single TCO layer. With the optically enhanced metal, good conductivity, transmission and barrier properties are achieved. Preferably the ITO layers, which antireflect the metal, each have a thickness of about 30-60 nanometers. In several instances, the samples were tested two times. For example, the second column for the 25 and 60 ohms/square samples reflects the results of the second test.

Although the present invention has been described and is illustrated with respect to various embodiments thereof, it is to be understood that it is not to be so limited, because changes and modifications may be made therein which are within the full intended scope of this invention as hereinafter claimed. In particular, the structure disclosed in the present invention for flat panel displays is schematic for LCD and other display technologies, such as polymer organic light emitting diode (POLED), small molecule organic light emitting diode (OLED) displays, and thin film electro-luminescent.

TABLE 1

| Sample | Water Vapor Transmission Rate (g/m² day) | | Oxygen Transmission Rate (cc/m² day) | |
|---|---|---|---|---|
| 25-1 | 0.026 | <0.005[1] | 0.017 | 0.087 |
| 25-2 | 0.097 | <0.005[1] | 0.584 | 0.257 |
| 60-1 | 0.042 | | 0.059 | 0.071 |
| 60-2 | 0.050 | | 0.204 | 0.090 |
| 60-3 | 0.007 | | <0.005[2] | |
| 60-4 | <0.005[1] | | 0.014 | |
| 300-1 | 0.243 | | 0.861 | |
| 300-2 | 0.243 | | 0.861 | |
| M-10-1 | 0.076 | | 0.035 | |
| M-10-2 | 0.041 | | 0.024 | |

[1]The actual water vapor transmission rate was at least as low as the lower limit of the instrument, Permatran-W 3/31, 0.005 g/m² day.
[2]The actual oxygen transmission rate was at least as low as the lower limit of the instrument, Ox-Tran 2/20, 0.005 cc/m² day.

Table 2 compares permeation rates for different coatings, including multiple dyad (an acrylate/oxide pair) layers on the polyethylene terephthalate (PET) substrate, and coatings on oriented polypropylene (OPP) substrates. As shown, a single dyad on a substrate has high oxygen and moisture permeation resistance. In some instances, two oxygen transmission rate tests were conducted, and the results were shown in a second column. Footnote[1] denotes the typical permeation rate for the PET substrate.

TABLE 2

| Sample | Water Vapor Transmission Rate (g/m² day) | Oxygen Transmission Rate (cc/m² day) | |
|---|---|---|---|
| 2 mil PET | 30.5, 272[1] per micron film thickness | 5.3, 1550[1] per micron film thickness | |
| Food packaging—target values (PET/oxide) | 1.55 | 1.5 | |
| 2 mil PET/single dyad (23° C.) | <0.0078 | 0.03 | |
| 2 mil PET/seven dyads (23° C.) | <0.0078 | <0.016 | |
| 7 mil PET/hardcoat (23° C.) | 7.6 | — | |
| 7 mil PET/hardcoat/single dyad (38° C.) | <0.0078, 90% Relative Humidity (RH), 100% O$_2$ | 0.2682, 100% RH | 0.6061, 100% RH |
| 7 mil PET/hardcoat/single dyad/ITO (38° C.) | <0.0078, 90% RH, 100% O$_2$ | 0.0098, 100% RH | 0.0128, 100% RH |
| PET/oxide | 0.7-1.5 | 0.15-0.9 | |
| PET/Al | 0.6 | 0.17 | |
| OPP, copolymer, 1 mil | 1800 | 1.3 | |
| OPP/oxide | 17-546 | 0.08-0.4 | |
| OPP/Al | 20 | 0.11 | |

What is claimed is:

1. An OLED comprising:
   a flexible plastic substrate coated with one or more vacuum-deposited in-situ polymerized layers of polymer and a first layer configuration comprising:
      a first transparent electrically conductive oxide layer,
      a transparent electrically conductive metal layer adjacent the first transparent electrically conductive oxide layer, and
      a second transparent electrically conductive oxide layer adjacent the transparent electrically conductive metal layer; and
   a light emitting material;
   wherein the OLED has a visible light transmittance of about 80-85%.

2. The OLED according to claim 1, wherein the flexible plastic substrate is further coated with a second layer configuration comprising a first transparent electrically conductive oxide layer, a transparent electrically conductive metal layer adjacent the first transparent electrically conductive oxide layer, and a second transparent electrically conductive oxide layer adjacent the transparent electrically conductive metal layer.

3. The OLED according to claim 2, wherein the first and second layer configurations are separated by one or more vacuum-deposited in-situ polymerized layers of polymer.

4. The OLED according to claim 1, wherein the OLED does not comprise a reflective metal layer.

5. A process for fabricating an OLED, the process comprising the steps of:
   (a) providing a substrate;
   (b) depositing over the substrate a first layer configuration, a second layer configuration, and one or more vacuum-deposited in-situ polymerized layers of polymer, each of the first and second layer configurations comprising a first transparent electrically conductive oxide layer, a transparent electrically conductive metal layer adjacent the first transparent electrically conductive oxide layer, and a second transparent electrically conductive oxide layer adjacent the transparent electrically conductive metal layer, wherein the first and second layer configurations are separated by one or more of the vacuum-deposited in-situ polymerized layers of polymer, and (c) depositing over the substrate a light emitting material;

wherein the OLED has a visible light transmittance of about 80-85%.

6. A process for fabricating an OLED, the process comprising the steps of:

(a) providing a substrate;

(b) depositing over the substrate a layer of in-situ polymerized organic monomer and an optically enhanced transparent electrically conductive three layer configuration comprising a first electrically conductive oxide layer, a transparent electrically conductive metal layer adjacent the first transparent electrically conductive oxide layer, and a second transparent electrically conductive oxide layer adjacent the transparent electrically conductive metal layer;

(c) applying the substrate to an OLED to obtain a visible light transmittance of about 80-85%.

7. The method according to claim 6, further comprising applying a polymeric base coat to smooth the substrate prior to deposition of a transparent electrically conductive oxide layer.

8. The method according to claim 6, further comprising heating the substrate during or after deposition of a transparent electrically conductive oxide layer.

9. The method according to claim 6, further comprising depositing one or more of the transparent electrically conductive oxide layers in a hydrogen-containing plasma.

10. The method according to claim 6, further comprising electrically connecting all electrically conductive layers in parallel.

11. The method according to claim 6, further comprising contacting the transparent conductive oxide layers with a roller without causing cracking or crazing of the electrically conductive oxide layers sufficient to reduce electrical conductivity.

* * * * *